(12) United States Patent
Masuoka et al.

(10) Patent No.: US 7,304,343 B2
(45) Date of Patent: Dec. 4, 2007

(54) SEMICONDUCTOR MEMORY DEVICE AND MANUFACTURING METHOD FOR THE SAME

(75) Inventors: Fujio Masuoka, Sendai (JP); Shinji Horii, Fukuyama (JP); Takuji Tanigami, Kashihara (JP); Takashi Yokoyama, Fukuyama (JP)

(73) Assignees: Fujio Masuoka, Sendai-shi (JP); Sharp Kabushiki Kaisha, Osaka (JP)

( * ) Notice: Subject to any disclaimer, the term of this patent is extended or adjusted under 35 U.S.C. 154(b) by 408 days.

(21) Appl. No.: 11/084,648

(22) Filed: Mar. 16, 2005

(65) Prior Publication Data

US 2005/0224847 A1 Oct. 13, 2005

(30) Foreign Application Priority Data

Mar. 17, 2004 (JP) .............................. 2004/076546

(51) Int. Cl.
*H01L 29/76* (2006.01)
(52) U.S. Cl. ...................................... 257/314
(58) Field of Classification Search ........ 257/312–315, 257/288, E27.084; 438/201, 211
See application file for complete search history.

(56) References Cited

U.S. PATENT DOCUMENTS

| 5,874,760 | A | 2/1999 | Burns, Jr. et al. |
| 5,999,453 | A | 12/1999 | Kawata |
| 6,255,689 | B1 | 7/2001 | Lee |
| 6,657,250 | B1 | 12/2003 | Rudeck |
| 6,808,987 | B2 * | 10/2004 | Hsiao et al. ................ 438/257 |
| 2005/0199912 | A1 | 9/2005 | Hofmann et al. |
| 2005/0199942 | A1 | 9/2005 | Hofmann et al. |

FOREIGN PATENT DOCUMENTS

| DE | 102 41 172 A1 | 3/2004 |
| DE | 102 41 173 A1 | 3/2004 |
| JP | 04-079369 A | 3/1992 |
| JP | 07-226449 A | 8/1995 |
| JP | 2870478 | 1/1999 |
| JP | 11-074382 A | 3/1999 |
| JP | 2001-077220 | 3/2001 |
| JP | 2002-359303 A | 12/2002 |

OTHER PUBLICATIONS

Annex to the European Search Report on European Patent Application No. 05251584.8 mailed on Nov. 7, 2005, four pages.

* cited by examiner

*Primary Examiner*—Nathan W Ha
(74) *Attorney, Agent, or Firm*—Morrison & Foerster LLP

(57) ABSTRACT

The present invention provides a semiconductor memory device including: a semiconductor substrate of a first conductivity type; and a memory cell including: (i) a columnar semiconductor portion formed on the substrate, (ii) at least two charge-storage layers formed around a periphery of the columnar semiconductor portion and divided in a direction vertical to the semiconductor substrate, and (iii) a control gate that covers at least a portion of charge-storage layers, wherein the memory cell is capable of holding two-bit or more data.

11 Claims, 23 Drawing Sheets

SEMICONDUCTOR MEMORY DEVICE AND MANUFACTURING METHOD FOR THE SAME

CROSS-REFERENCE TO RELATED APPLICATION

This application is related to Japanese application No. 2004-76546 filed on Mar. 17, 2004, whose priority is claimed under 35 USC § 119, the disclosure of which is incorporated by reference in its entirety.

BACKGROUND OF THE INVENTION

1. Field of the Invention

The present invention relates to a semiconductor memory device and a manufacturing method for the same. More particularly, the present invention relates to a semiconductor memory device having at least two divided charge-storage layers and a control gate, and a manufacturing method for the same.

2. Description of the Related Art

Non-volatile semiconductor memory devices including a flash memory are in use in a variety of fields such as computer, communication, measurement equipment, automatic control apparatus, consumer electronics for private use and the like as compact data-recording media having a large capacity. Accordingly, demand for non-volatile memories having a larger capacity and available at a lower cost is very high.

However, the capacity of a so-called planar type memory wherein semiconductor memory devices (memory cells) are formed in a plane on a semiconductor substrate is restricted by the minimum processing dimension (feature size) on which the resolution limit of photolithography technology is imposed. Under such circumstances, multi-value technology and three-dimensional technology of a memory cell are studied as technologies for enabling the integration in the next generation without relying on an improvement in the photolithography technology.

The multi-value technology is roughly divided into two types of technologies: threshold-value control type technology to set three or more threshold-value distributions in one memory cell; and charge-storage-region divided type technology to provide, in one memory cell, divided regions for independently storing a charge. Examples of the former threshold value control type technology include floating gate type technology, while known as examples of the latter charge-storage-region divided type technology are NROM type technology (see, for example, Japanese Unexamined Patent Publication No. 2001-77220), divided floating gate type technology (see, for example, Japanese Patent No. 2870478) and the like technology.

FIG. 25 shows a schematic cross section of a NROM type memory array which is a drawing contained in Japanese Unexamined Patent Publication No. 2001-77220, a publication disclosing the charge-storage-region divided type technology. In the NROM type memory array, memory cells each including a charge-storage layer made of an oxide film/nitride film/oxide film (ONO film) are arranged in the form of an array. In FIG. 25, reference numeral 1 denotes a semiconductor substrate, 12 a bitline, 15 a channel, 17 a nitride layer, 18 an oxide layer, 20 another oxide layer, 50 bitline-like oxide, 51 sidewall oxide and 60 a polysilicon wordline.

Referring to FIG. 25, two regions for holding a charge can be arranged in the charge-storage layer made of the oxide film/nitride film/oxide film (ONO film), and two-bit data can be stored in one memory cell.

In the multi-value technology, a capacity of two-bit or more data per one memory cell is secured with the same processing dimensions as those of a memory cell that has a capacity of one-bit data per one memory cell, thereby overcoming the capacity restriction due to the resolution limit of the photolithography technology.

In the three-dimensional technology of a memory cell, on the other hand, memory cells can be placed also perpendicularly to the direction to a substrate to provide, as is the case with the multi-value technology, a capacity equal to or greater than that of a planar type memory with the same processing dimensions as those of the planar type memory. Further, this technology in which the precision required for the control of the amount of charge is the same as that required in the planar type memory can provide a further increased capacity with an increase in the number of memory cells to be placed in the direction perpendicular to the substrate.

In the multi-value technology of a memory cell, the planar technology is utilized, and a capacity of two-bit or more data is secured per one memory cell. In the threshold value control type multi-value technology and charge-storage-region divided type multi-value technology in which the planar technology is utilized as mentioned above, however, memory cells are arranged in a plane. In these technologies, with a reduction in memory cell area, the distance between the source and drain regions decreases, inducing a punch-through phenomenon. This hinders the scaling down. For this reason, the multi-value technology is not appropriate for high integration. Further, in the multi-value technology, the channel width also decreases with a reduction in memory cell area, causing an apprehension about a reduction in drive voltage and thus about a decrease in read out operation speed.

In the three-dimensional technology, memory cells are arranged in a direction perpendicular to a semiconductor substrate surface in order to secure a capacity equal to or greater than that of a planar type memory. In this technology, however, as a greater number of memory cells are stacked in multiple stages, a greater number of manufacturing steps are required, causing an increase in manufacturing costs, an extension in the length of period for manufacture and a decrease in yield. Further, due to differences in thermal hysteresis among stages, the memory cells manufactured vary in the qualities of a tunnel film as an element of a memory cell and in the profile of a diffusion layer. Consequently, cell characteristics vary.

SUMMARY OF THE INVENTION

An object of the present invention is to solve at once problems caused by the scaling down realized by utilizing the multi-value technology and problems lying in the three-dimensional technology such as variations in cell characteristics, an increase in manufacturing costs, an extension in the length for manufacture, a decrease in yield and difficulties in process control and thereby to provide a semiconductor memory device having a large capacity and available at a low cost.

The present invention provides a semiconductor memory device comprising: a semiconductor substrate of a first conductivity type; and a memory cell including: (i) a columnar semiconductor portion formed on the substrate, (ii) at least two charge-storage layers formed around a periphery of the columnar semiconductor portion and divided in a direction vertical to the semiconductor substrate, and (iii) a control gate that covers at least a portion of charge-storage layers, wherein the memory cell is capable of holding two-bit or more data.

Also, the present invention provides a manufacturing method of a semiconductor memory device comprising the steps of: forming a columnar semiconductor portion on a semiconductor substrate of a first conductivity type; forming at least two charge-storage layers around a periphery of the columnar semiconductor portion, the charge-storage layers divided in a direction vertical to the semiconductor substrate; and forming a control gate that covers at least a portion of charge-storage layers.

DESCRIPTION OF THE PREFERRED EMBODIMENTS

Figure 1:
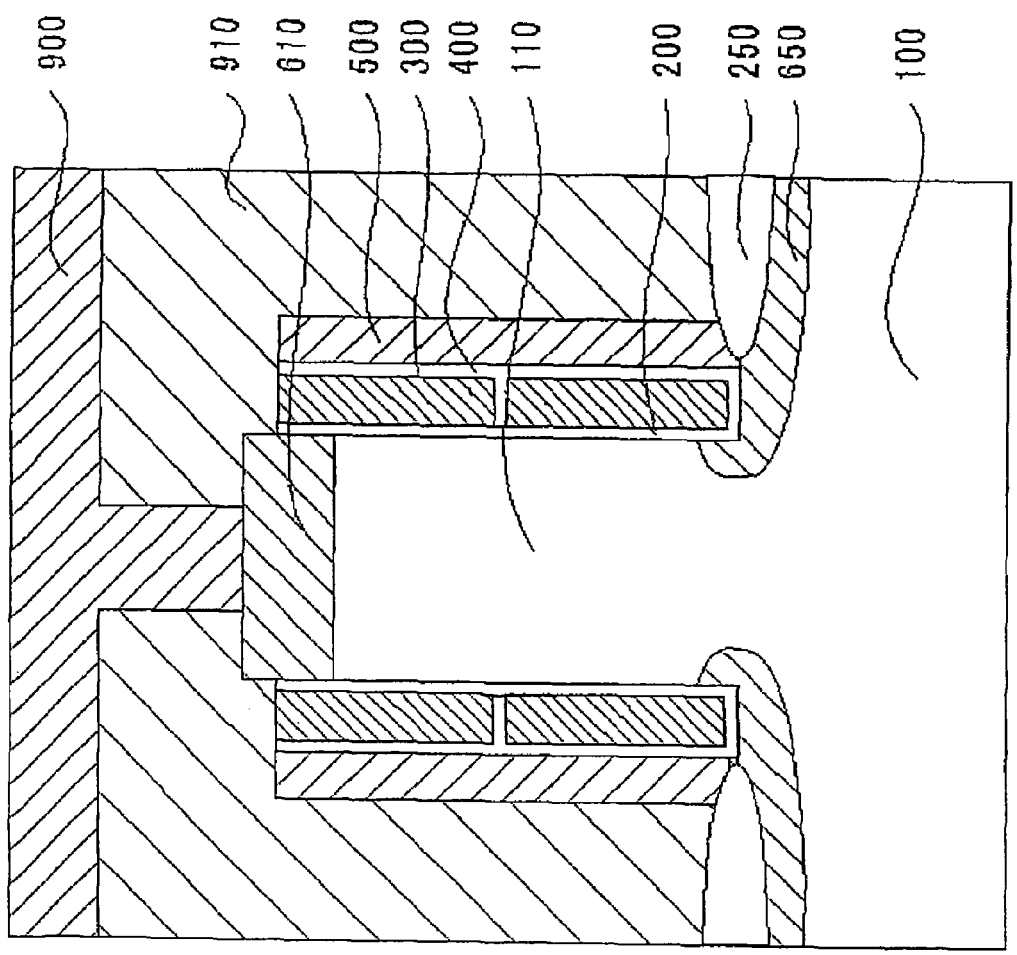
FIG. 1 is a schematic cross section of a semiconductor memory device according to an embodiment 1 of the present invention.

The semiconductor substrate according to the present invention is not particularly limited, and any known substrate may be used. For example, bulk substrates made of element semiconductor such as silicon, germanium and the like and compound semiconductor such as GaAs, InGaAs, ZnSe, GaN and the like may be used. Further, as substrates that have a semiconductor layer thereon, various substrates such as a SOI (Silicon on Insulator) substrate, a SOS substrate and a multilayer SOI substrate, as well as a glass substrate and a plastic substrate that have a semiconductor layer thereon may be used. Among these, preferred are a silicon substrate, a SOI substrate that has a silicon layer on a surface thereof, and the like substrate. The semiconductor substrate according to the present invention is of a first conductivity type which is a p-type or n-type.

According to the present invention, the substrate has a columnar (island-like, pillar) semiconductor portion formed thereon. The columnar semiconductor portion is made of the same material as or a material different from the material of the substrate, preferably made of the same material, and more preferably made of silicon. The shape of the columnar semiconductor portion is not particularly limited, and various shapes such as circle, prism (triangle, square, polygon), conifer, pyramid and the like may be employed. Further, the columnar semiconductor portion may have a shape having a longitudinal cross section in which the length along a surface of the substrate vary in a step-by-step manner (see, for example, the shape of a columnar semiconductor portion denoted by the reference numeral 110 in FIG. 8). The columnar semiconductor portion may be of the same conductivity type as or a conductivity type opposite to that of the substrate.

The height of the columnar semiconductor portion is not particularly limited, can be varied in response to the laminating number of memory cells. When memory cell is one, the height of the columnar semiconductor portion may be range of 100 to 10000 nm.

The method of forming the columnar semiconductor portion is not particularly limited, and any known method may be used. For example, a method by depositing a semiconductor layer on the substrate by means of an epitaxial method and etching the semiconductor layer to form the columnar semiconductor portion and a method by digging the substrate by means of etching the columnar semiconductor portion may be used.

Next, said at least two charge-storage layers that are divided in a direction vertical to the semiconductor substrate are formed around the periphery of the columnar semiconductor portion. The material of the charge-storage layers is not particularly limited, and for example, silicon nitride, polycrystalline silicon, silicate glass, silicon carbide, alumina, high-k materials (hafnium oxide, zirconium oxide, tantalum oxide and the like), zinc oxide, ferroelectric, a metal and the like may be used.

The number of divided charge-storage layers is not particularly limited as long as it is equal to or greater than two. When considering the easiness of write operation and the like, however, it is preferably two or three.

Usually, an insulating film (for example, silicon oxide film) is interposed between the charge-storage layers and the columnar semiconductor portion.

The method of forming the charge-storage layers is not particularly limited, and for example, a method by repeating a cycle of deposition and etching depending on the number of divided charge-storage layers to be formed may be used. In the case where the columnar semiconductor portion has a shape shown in FIG. 8, the charge-storage layers may be formed in a self-aligned manner by utilizing the step portion.

Further, at least a portion of charge-storage layers is covered with the control gate. The material of the control gate is not particularly limited, and for example, semiconductor such as polycrystalline silicon, amorphous silicon and the like; silicide; a metal; a material having a high melting point; and the like may be used.

The area of each charge-storage layer covered with the control gate is not particularly limited as long as a charge can be stored into and released from each charge-storage layer by applying a predetermined voltage to the control gate. When considering the simplicity of manufacturing method, however, preferably, all the surfaces of each charge-storage layer are covered with the control gate.

Usually, an insulating film (for example, silicon oxide film) is interposed between the charge-storage layers and the columnar semiconductor portion.

Further, impurity diffusion layers are formed respectively above and below the columnar semiconductor portion. The impurity diffusion layers function as source/drain regions. The impurity diffusion-layer formed below may extend from the columnar semiconductor portion onto the semiconductor substrate. Or, the impurity diffusion layer formed below may be provided only on the semiconductor substrate. The impurity diffusion layer is preferably of the second conductivity type when the semiconductor substrate and the columnar semiconductor portion are of the first conductivity type, while the impurity diffusion layer is preferably of the first conductivity type when the columnar semiconductor portion is of the second conductivity type.

The memory cell that includes the above constitutional requirements has said at least two divided charge-storage layers, and thereby can hold two-bit or more data.

Next, the present invention will be explained in detail based on the preferred embodiments shown in the drawings. It should be understood that the present invention is not limited to the embodiments.

Embodiment 1

FIG. 1 is a schematic cross section of a memory cell according to Embodiment 1. In the figure, reference numeral 100 denotes a p-type semiconductor substrate, 110 a columnar semiconductor portion, 200 a tunnel oxide film, 250 a device isolation film, 300 charge-storage layers (floating gates), 400 an interlayer insulating film, 500 a control gate, 610 and 650 source/drain diffusion layers, 900 a metal wiring, and 910 another interlayer insulating film.

In Embodiment 1, at least one p-type columnar semiconductor portion 110 is formed on the p-type semiconductor substrate 100 made of silicon. At least a portion of a periphery of the columnar semiconductor portion 110 serves as an active region surface. The tunnel oxide film 200 is formed on at least a portion of the active region surface. Also, the charge-storage layers 300 made of, for example, polycrystalline silicon that are divided in a direction vertical to the p-type semiconductor substrate 100 are formed to cover at least a portion of the tunnel oxide film 200. The interlayer insulating film 400 made of, for example, a so-called ONO film (oxide film/nitride film/oxide film) is formed to cover at least a portion of each charge-storage layer 300. The control gate 500 made of, for example, polycrystalline silicon is arranged to cover at least a portion of charge-storage layers 300. Also, the source/drain diffusion regions 610 and 650 are formed respectively above and below the columnar semiconductor portion 110.

Embodiment 2

Figure 2:
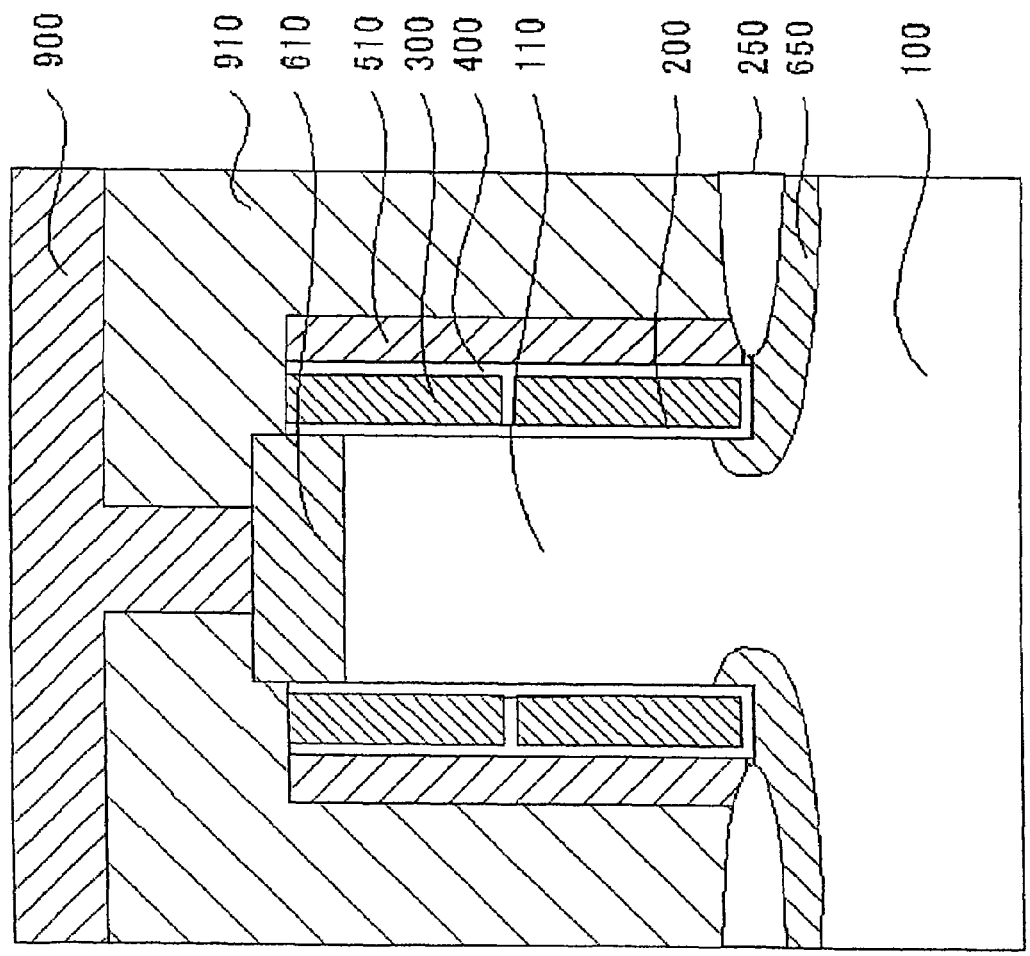
FIG. 2 is a schematic cross section of a semiconductor memory device according to an embodiment 2 of the present invention.

A memory cell shown in FIG. 2 has the same construction as that in Embodiment 1 except that a control gate 510 is made of a metal. Examples of the materials of the control gate 510 include metals such as aluminum, tungsten, copper and the like. Since the control gate is made of a metal, it is possible to reduce the resistance of wordlines and suppress the wiring delay and the like.

Embodiment 3

Figure 3:
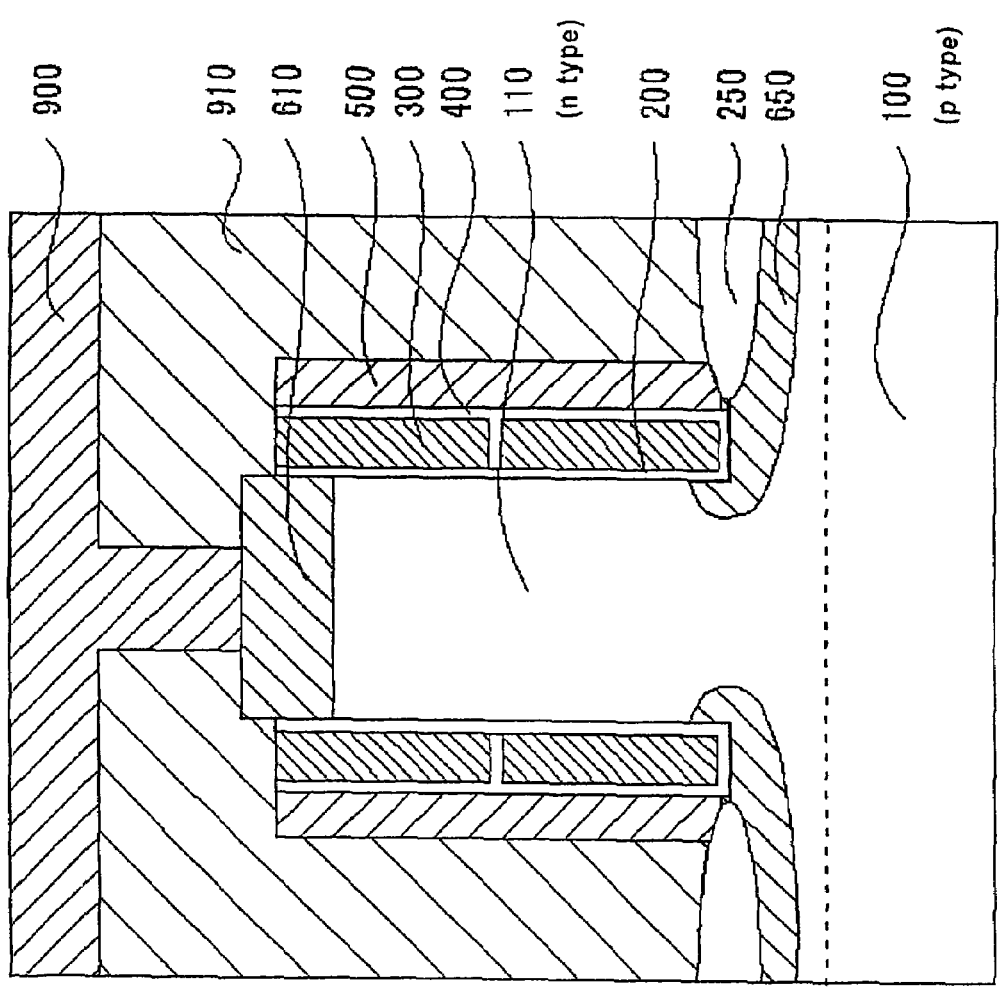
FIG. 3 is a schematic cross section of a semiconductor memory device according to an embodiment 3 of the present invention.

A memory cell shown in FIG. 3 has the same construction as that in Embodiment 1 except that the columnar semiconductor portion 110 is made of n-type silicon. In this embodiment, the source/drain diffusion regions 610 and 650 that are formed respectively above and below the columnar semiconductor portion 110 are of a p-type, the conductivity type opposite to that of the columnar semiconductor portion.

Theories of Operations of the Memory Cells According to Embodiments 1-3

The above semiconductor memory devices have a memory function provided based on the conditions of a charge stored in the charge-storage layers. In the below, the theories of a read out operation, a write operation and an erasure operation will be described by taking the memory cell shown in FIG. 1 as an example.

(1) The Theory of the Read Out Operation will be Described Below.

Figure 4:
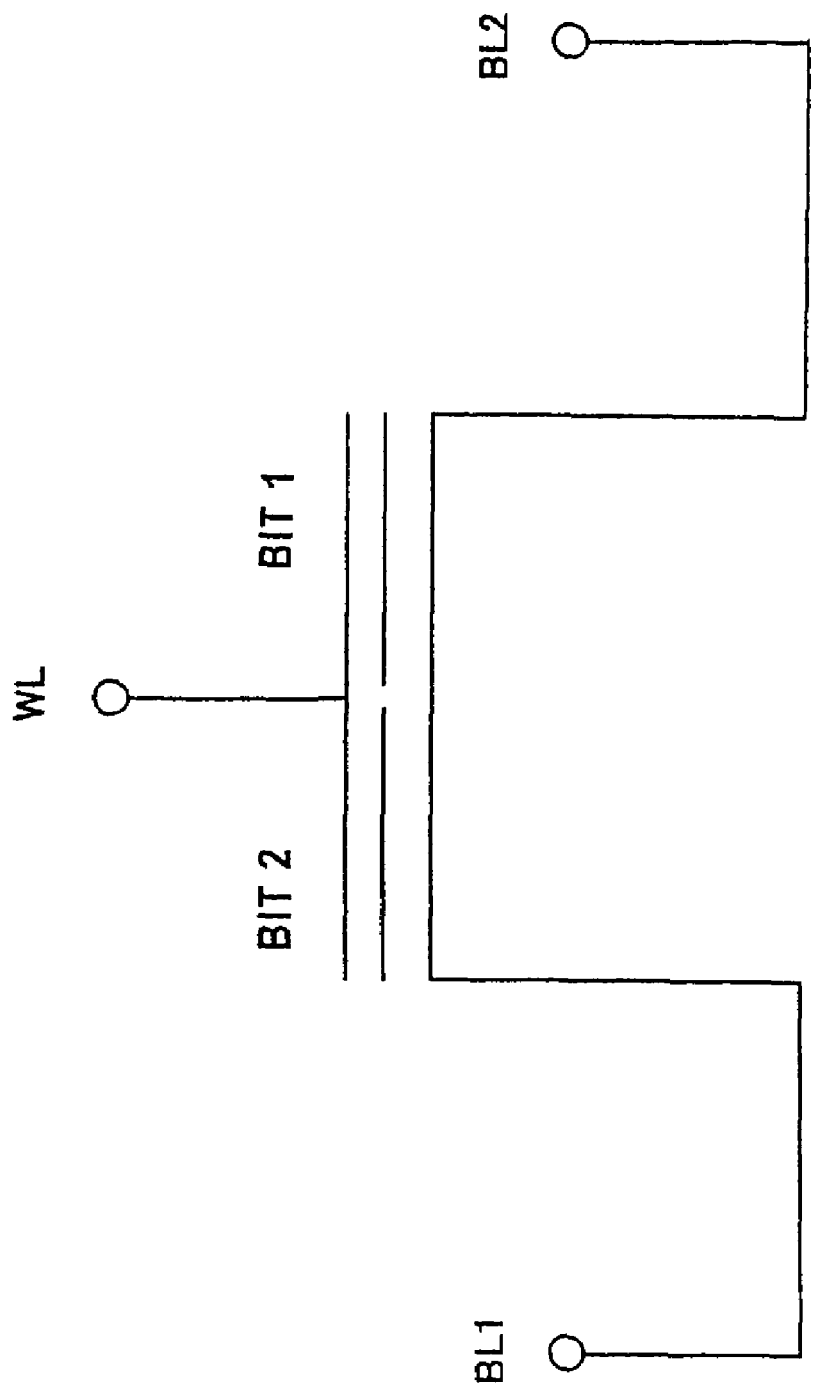
FIG. 4 shows an equivalent circuit of the semiconductor memory device according to Embodiment 1.
Figure 5:
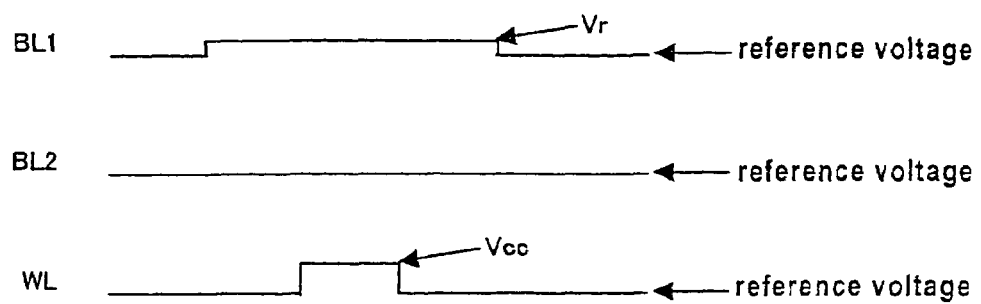
FIG. 5 shows a timing chart for explaining the theories of operations of the semiconductor memory devices according to Embodiments 1 to 3.

FIG. 4 shows an equivalent circuit of the memory cell of FIG. 1, and FIG. 5 shows an example of a timing chart at the reading out.

In the equivalent circuit shown in FIG. 4, in reading data out of bit 1, a read out voltage Vr (for example, 1.5 V) is applied to BL1, a reference voltage (for example, 0 V) is applied to BL2 and Vcc (for example, 3 V) is applied to wordline WL to allow the determination of "0" or "1" of bit 1 depending on the magnitude of a current.

Also in reading data out of bit 2, in compliance with the above theory of the read out operation, the read out voltage Vr (for example, 1.5 V) is applied to BL2, the reference voltage (for example, 0 V) is applied to BL1 and the Vcc (for example, 3 V) is applied to wordline WL to allow the determination of "0" or "1" of bit 2 depending on the magnitude of a current.

The above theory of the read out operation can also be applied to the memory cell shown in FIG. 2. Further, in the case where an n-type columnar semiconductor portion is formed on a p-type semiconductor substrate as shown in FIG. 3, data can be read out by reversing the polarity of each voltage applied at the reading out of the memory cell shown in FIG. 1. This theory of the read out operation of the memory cell shown in FIG. 3 can also be applied to a memory cell having an n-type columnar semiconductor portion formed on an n-type silicon substrate.

(2) The Theory of the Write Operation will be Described Below.

An example of the theory of the write operation by means of hot electron injection will be described with reference to FIG. 4 that shows the equivalent circuit of the memory cell shown in FIG. 1.

Figure 6:
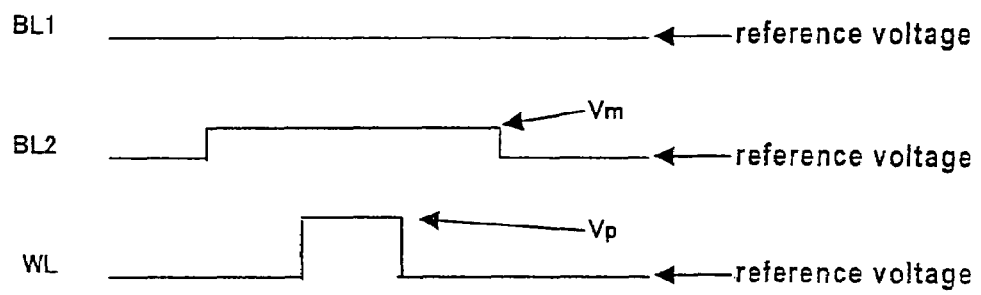
FIG. 6 shows another timing chart for explaining the theories of operations of the semiconductor memory devices according to Embodiments 1 to 3.

In writing data into, for example, bit 1, the reference voltage (for example, 0 V) is applied to BL1, a middle voltage Vm (for example, 4.5 V) is applied to BL2 and a high voltage Vp (for example, 9V) is applied to wordline WL to allow the writing of data. FIG. 6 shows an example of a timing chart at the writing.

Also in writing data into bit 2, in compliance with the above theory of the write operation, the reference voltage (for example, 0 V) is applied to BL2, the middle voltage Vm (for example, 4.5 V) is applied to BL1 and the high voltage Vp (for example, 9 V) is applied to wordline WL to allow the writing of data.

Here, means for changing the conditions of a charge in the charge-storage layers at the writing is not limited to the hot electron injection as long as it is possible to change the conditions of a charge in the charge-storage layers and, for example, Fowler-Nordheim tunneling current (hereinafter referred to as F-N tunnel current), direct tunnel current and the like may be used.

The above theory of the write operation can also applied to the memory cells shown in FIG. 2. Further, in the case where the n-type columnar semiconductor portion is formed on the p-type semiconductor substrate as shown in FIG. 3, data can be written by reversing the polarity of each voltage applied at the writing of the memory cell shown in FIG. 1. This theory of the write operation of the memory cell shown in FIG. 3 can also be applied to the memory cell having the n-type columnar semiconductor portion formed on the n-type silicon substrate.

(3) The Theory of the Erasure Operation will be Described Below.

An example of the theory of the erasure operation by means of hot hole injection will be described with reference to FIG. 4 that shows the equivalent circuit of the memory cell shown in FIG. 1.

Figure 7:
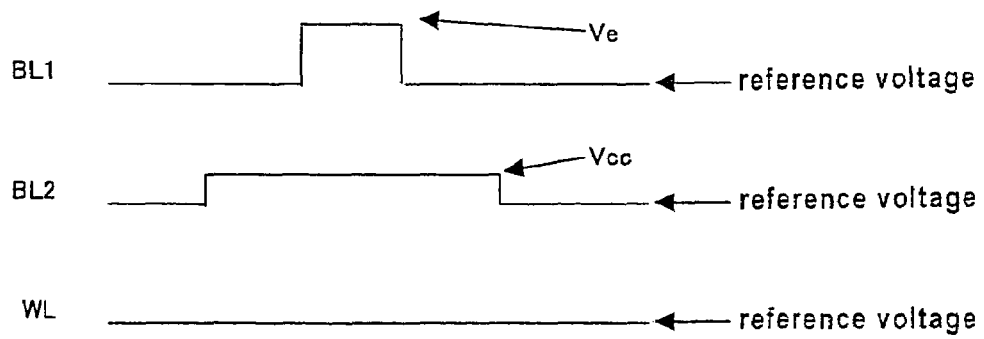
FIG. 7 shows another timing chart for explaining the theories of operations of the semiconductor memory devices according to Embodiments 1 to 3.

In erasing data from, for example, bit 1, a high voltage Ve (for example, 9 V) is applied to BL1, the Vcc (for example, 3 V) is applied to BL2 and the reference voltage (for example, 0 V) is applied to wordline WL to allow the erasure of data. FIG. 7 shows an example of a time chart at the erasure.

Also in erasing data from bit 2, in compliance with the above theory of the erasure operation, the high voltage Ve (for example, 9 V) is applied to BL2, the Vcc is applied to BL1 (for example, 3 V) and the reference voltage (for example, 0 V) is applied to wordline WL to allow the erasure of data.

Further, the batch erasure of erasing bit 1 and bit 2 sequentially may be carried out. The order in which bit 1 and bit 2 are erased is not particularly limited.

Further, means for changing the conditions of a charge in the charge-storage layers at the erasure is not limited to the hot electron injection as long as it is possible to change the conditions of a charge in the charge-storage layers and, for example, F-N tunnel current, direct tunnel current and the like may be employed.

The above theory of the erasure operation can also applied to the memory cell shown in FIG. 2. Further, in the case where the n-type columnar semiconductor portion is formed on the p-type semiconductor substrate as shown in FIG. 3, data can be erased by reversing the polarity of each voltage applied at the erasure of the memory cell shown in FIG. 1. This theory of the erasure operation of the memory cell shown in FIG. 3 can also be applied to the memory cell having the n-type columnar semiconductor portion formed on the n-type silicon substrate.

Embodiment 4

Figure 8:
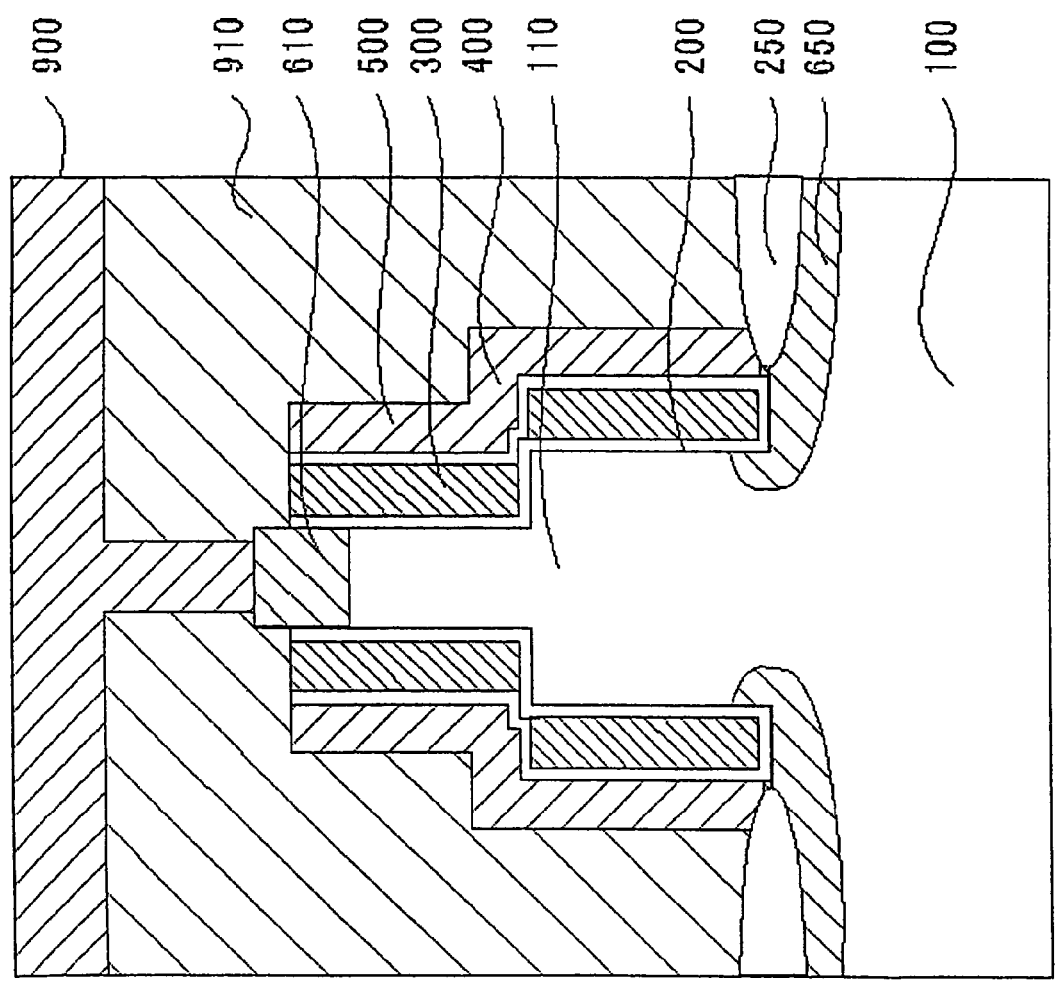
FIG. 8 is a schematic cross section of a semiconductor memory device according to an embodiment 4 of the present invention.

FIG. 8 is a schematic cross section of a memory cell according to Embodiment 4. In the figure, the same component as in FIG. 1 is denoted by the same reference numeral.

In Embodiment 4, the columnar semiconductor portion 110 having at least one step portion is formed on the p-type semiconductor substrate 100 made of silicon. At least a portion of a periphery of the columnar semiconductor portion 110 serves as an active region surface. The tunnel oxide film 200 is formed on at least a portion of the active region surface. Also, the charge-storage layers 300 made of, for example, polycrystalline silicon that are divided in a direction vertical to the p-type semiconductor substrate 100 by utilizing the step portion of the columnar semiconductor portion as a boundary of the charge-storage layers 300 are formed to cover at least a portion of the tunnel oxide film 200. The interlayer insulating film 400 made of, for example, a so-called ONO film (oxide film/nitride film/oxide film) is formed to cover at least a portion of charge-storage layers 300. The control gate 500 made of, for example, polycrystalline silicon is arranged to cover at least a portion of charge-storage layers 300. The source/drain diffusion regions 610 and 650 are formed respectively above and below the columnar semiconductor substrate 110.

Also in this memory cell, the read out, write and erasure can be carried out in the same manner as in Embodiment 1.

An example of a manufacturing method for the memory cell according to Embodiment 4 will now be described with reference to FIGS. 9 to 23. However, no detailed description will be given to the step of applying and removing a photoresist.

Figure 9:
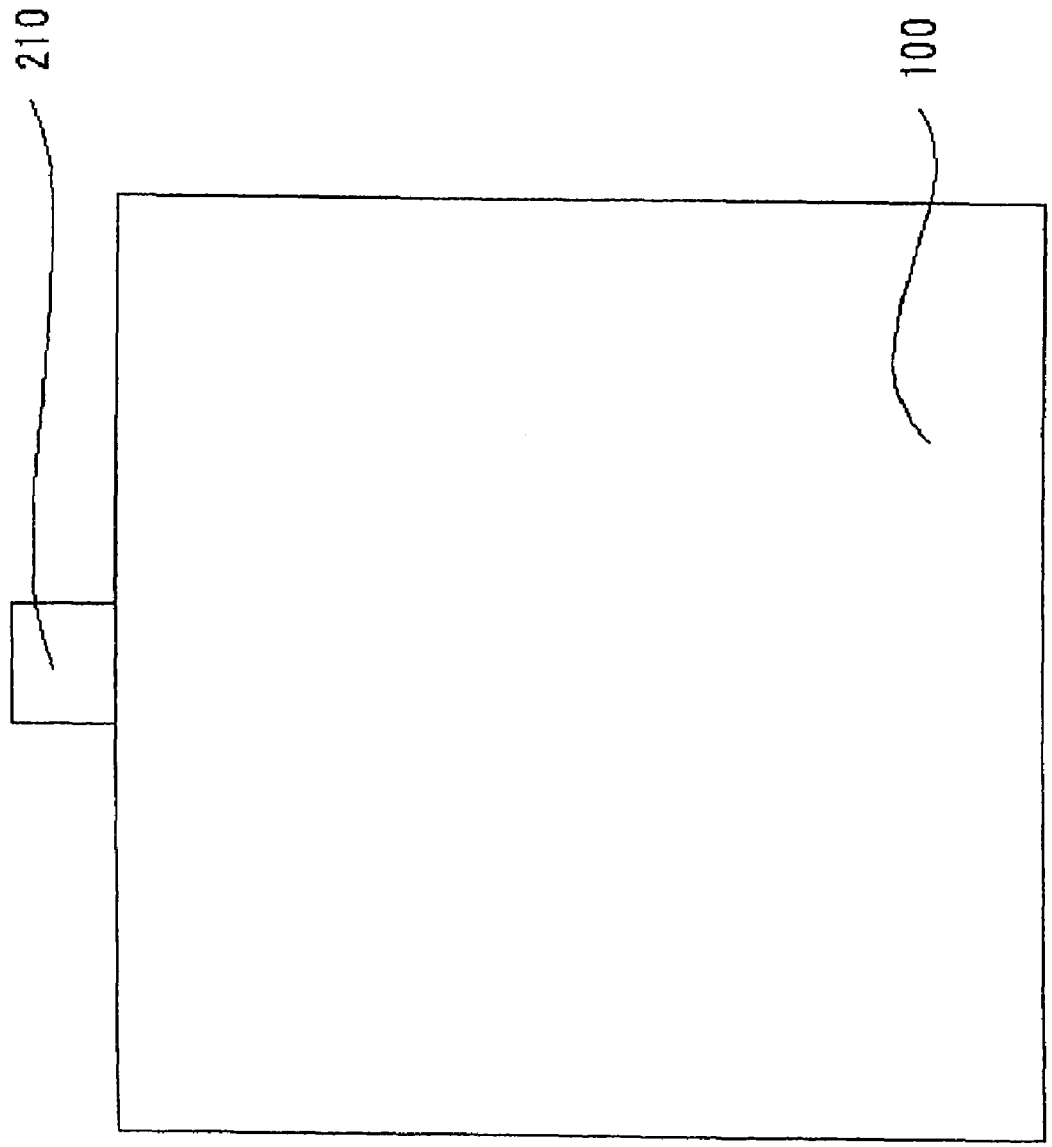
FIG. 9 is a schematic cross section for explaining a step of a manufacturing method for the semiconductor memory device according to Embodiment 4.

First, a silicon oxide film, for example, is deposited to a thickness of 200 nm to 2000 nm on a surface of the p-type semiconductor substrate 100 made of silicon, as a first insulating film 210 to be a mask layer. Next, the first insulating film 210 is etched by means of reactive ion etching by using as a mask a resist R1 that was patterned by a known photolithography technique (FIG. 9).

The material of the first insulating film 210 is not limited to the silicon oxide film as long as it is a material which is not etched or the etching rate of which is lower than that of silicon at the time of the reactive etching of the p-type semiconductor substrate 100, and other than the silicon oxide film, a silicon nitride film, a conductive film or a laminated film of two or more kinds of materials may be used.

Figure 10:
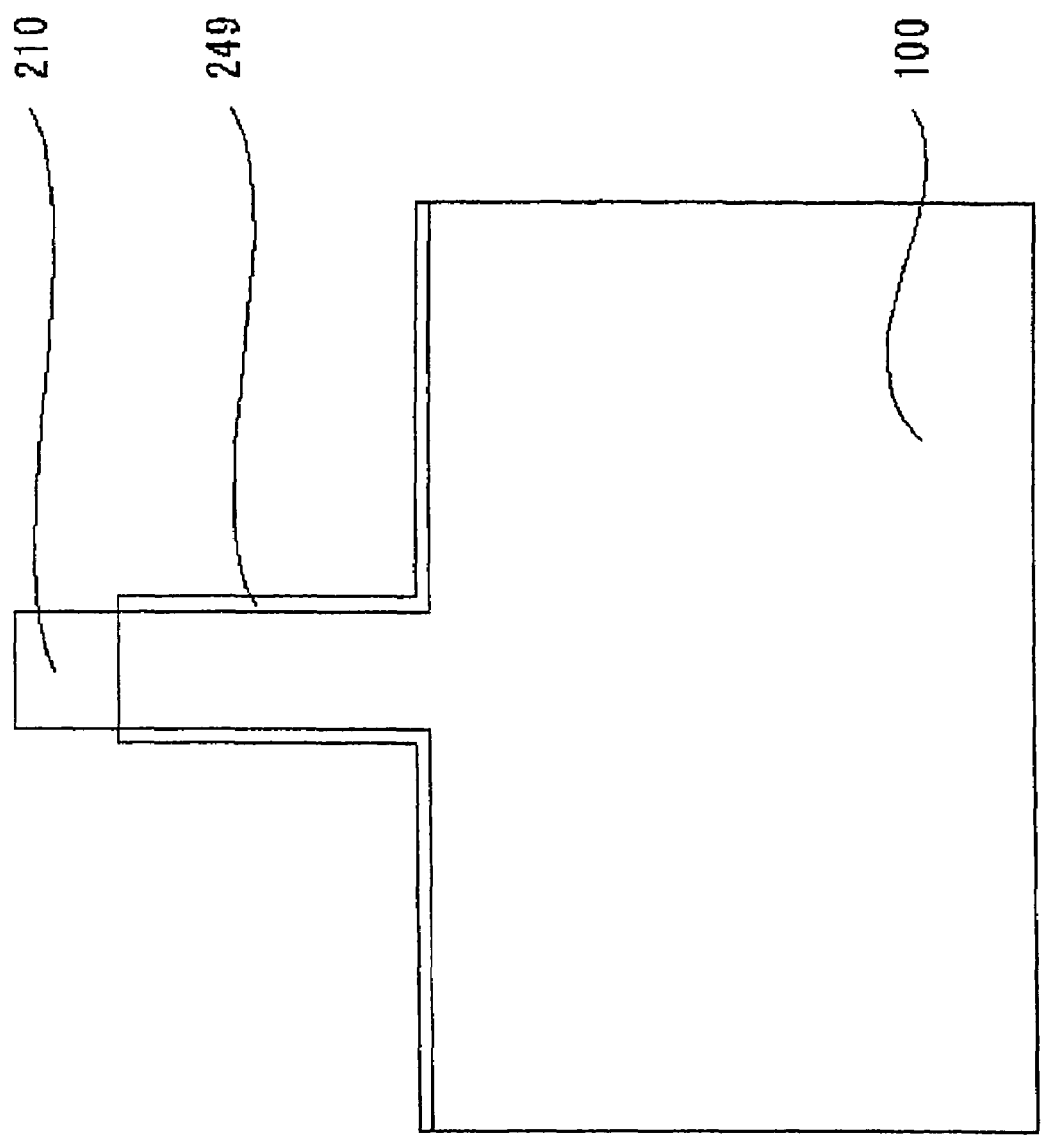
FIG. 10 is a schematic cross section for explaining another step of the manufacturing method for the semiconductor memory device according to Embodiment 4.

Subsequently, by using the resulting first insulating film 210 as a mask, the p-type semiconductor substrate 100 is etched by means of reactive ion etching by 50 nm to 5000 nm to form a projection (wall). After that, the exposed portion of the p-type semiconductor substrate 100 is thermally oxidized to form, for example, a silicon oxide film to a thickness of 5 nm to 100 nm, as a second insulating film 249 (FIG. 10).

Figure 11:
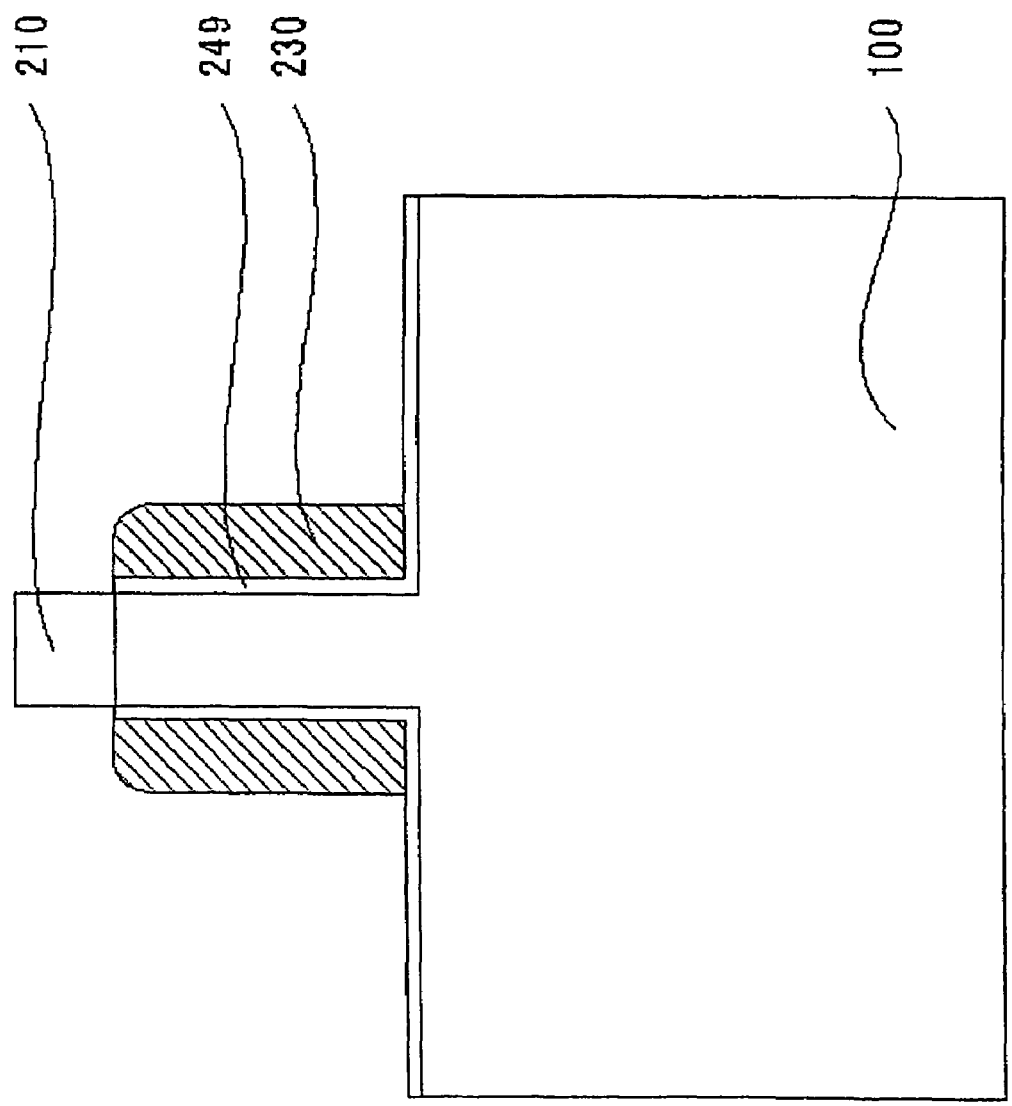
FIG. 11 is a schematic cross section for explaining another step of the manufacturing method for the semiconductor memory device according to Embodiment 4.

Next, a silicon nitride film, for example, is deposited to a thickness of 10 nm to 1000 nm as a third insulating film 230. After that, the third insulating film 230 is patterned by anisotropic etching to form a sidewall spacer on the silicon oxide film 249 around a periphery of the projection (wall) of the p-type silicon substrate 100 (FIG. 11).

Figure 12:
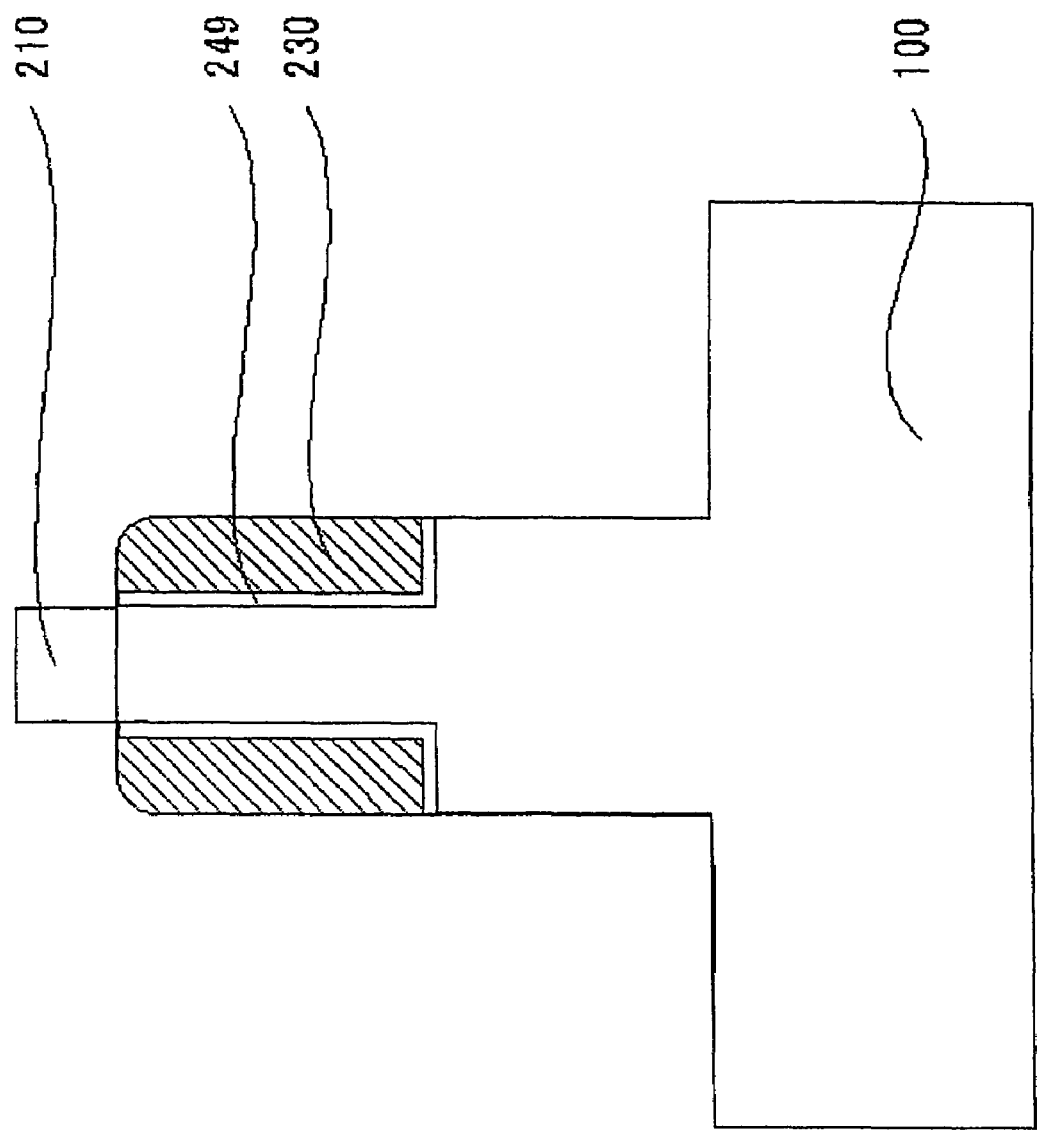
FIG. 12 is a schematic cross section for explaining another step of the manufacturing method for the semiconductor memory device according to Embodiment 4.

Subsequently, by using as a mask the third insulating film 230 that was patterned into the sidewall spacer, a portion of the second insulating film 249 is removed by means of reactive ion etching. Subsequently, the exposed portion of the p-type semiconductor substrate 100 is etched by a thickness of 50 nm to 5000 nm to pattern the p-type semiconductor substrate 100 into a columnar semiconductor having a step portion (FIG. 12).

After that, the exposed portion of the p-type semiconductor substrate 100 is subjected to, for example, thermal oxidation to form, for example, a silicon oxide film to a thickness of 5 nm to 100 nm, as an insulating film. The silicon oxide film as the insulating film may be formed by means of deposition. Or, a silicon nitride film, for example, may be formed instead of the silicon oxide film. Further, such formation of the silicon oxide film as the insulating film may be omitted.

Figure 13:
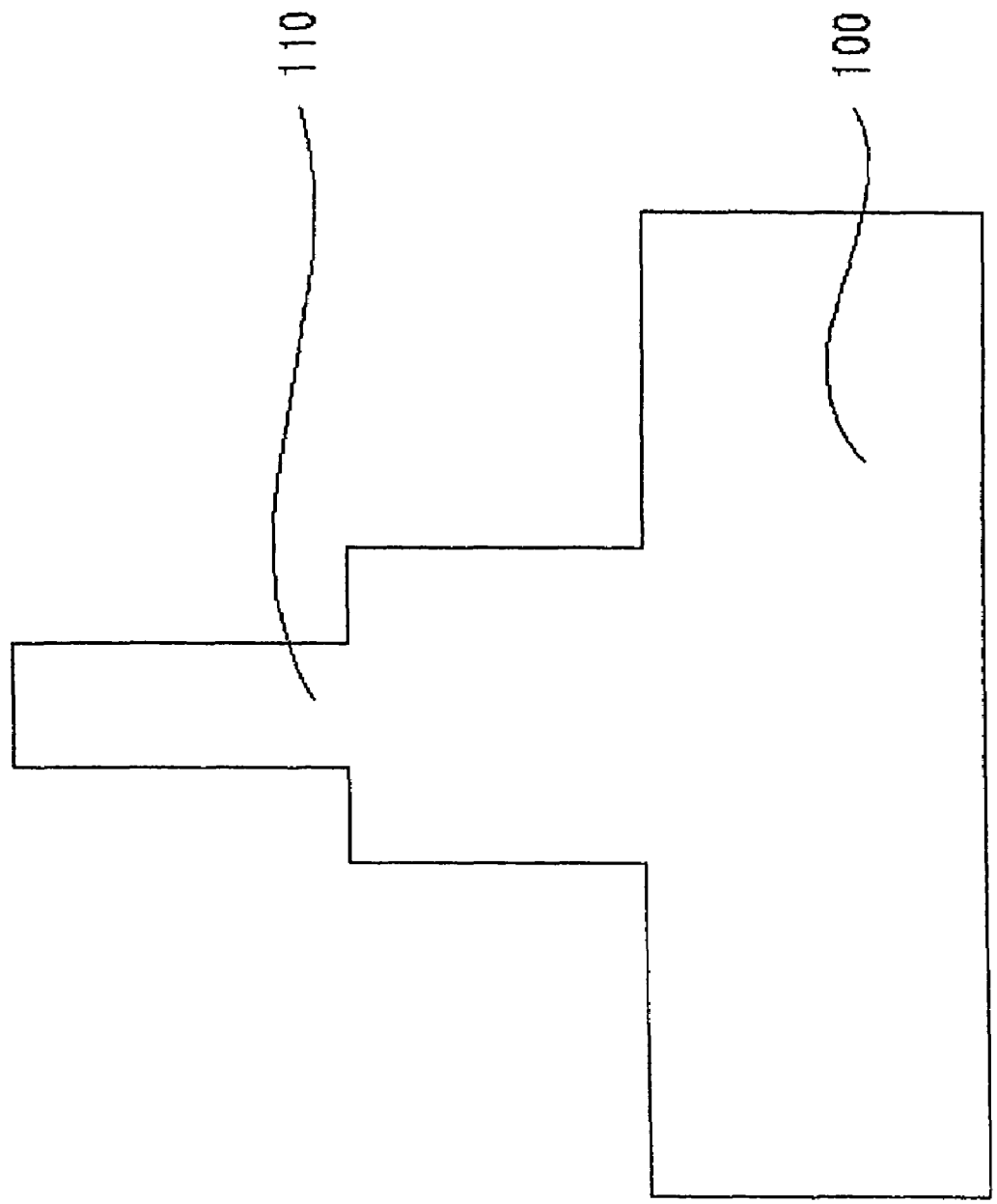
FIG. 13 is a schematic cross section for explaining another step of the manufacturing method for the semiconductor memory device according to Embodiment 4.

After that, the first to third insulating films (210, 249 and 230) are selectively removed by means of, for example, isotropic etching to expose the columnar semiconductor portion 110 (FIG. 13).

Figure 14:
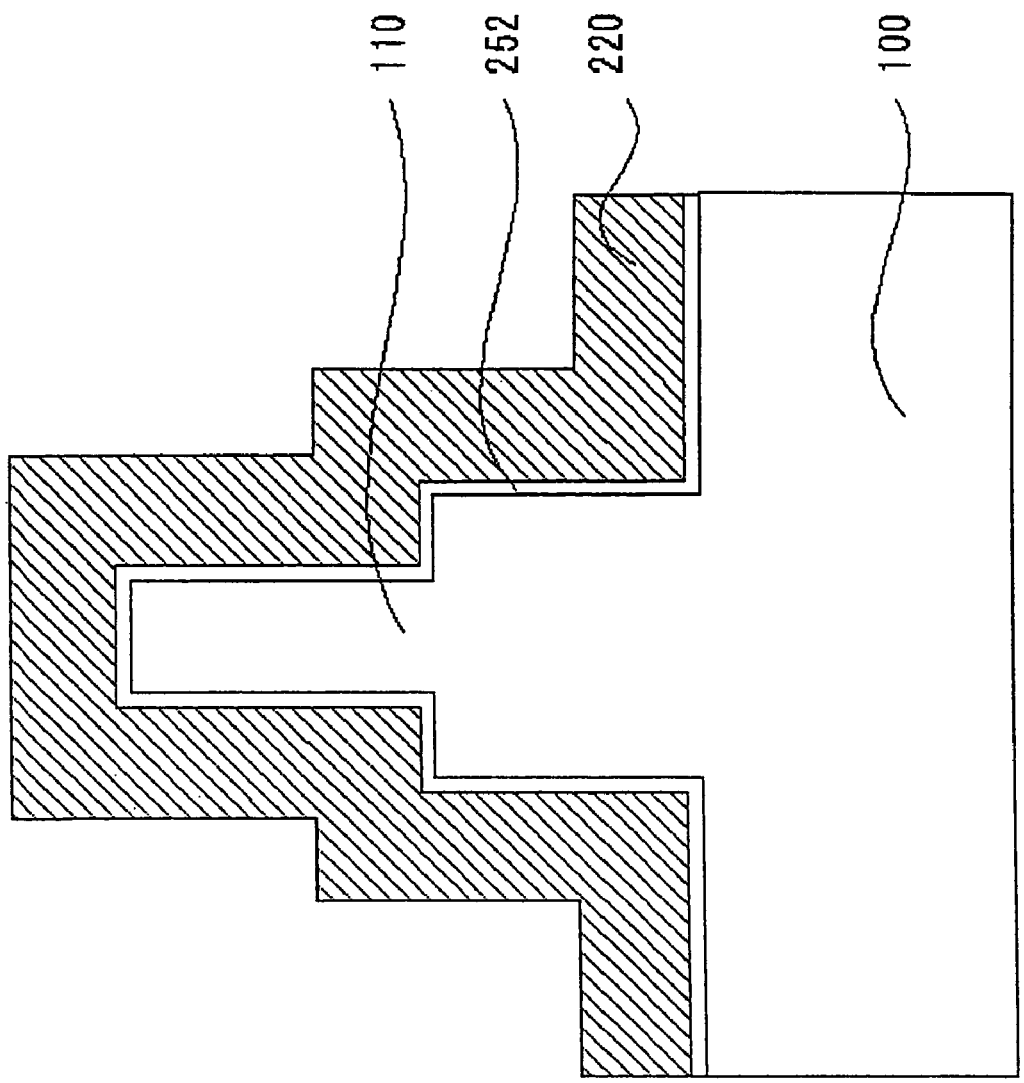
FIG. 14 is a schematic cross section for explaining another step of the manufacturing method for the semiconductor memory device according to Embodiment 4.

Next, thermal oxidation, for example, is carried out to form, for example, a silicon oxide film to a thickness of 5 nm to 100 nm, as a fourth insulating film 252. Here, it is possible to reduce the diameter of the columnar semiconductor portion 110 by forming the fourth insulating film 252, and if the diameter of the columnar semiconductor portion 110 is the minimum processing dimension, the diameter of the columnar semiconductor portion 110 is reduced to a value smaller than that of the minimum, processing dimension. Further, a silicon nitride film, for example, is deposited to a thickness of 10 nm to 1000 nm as a fifth insulating film 220 (FIG. 14).

Figure 15:
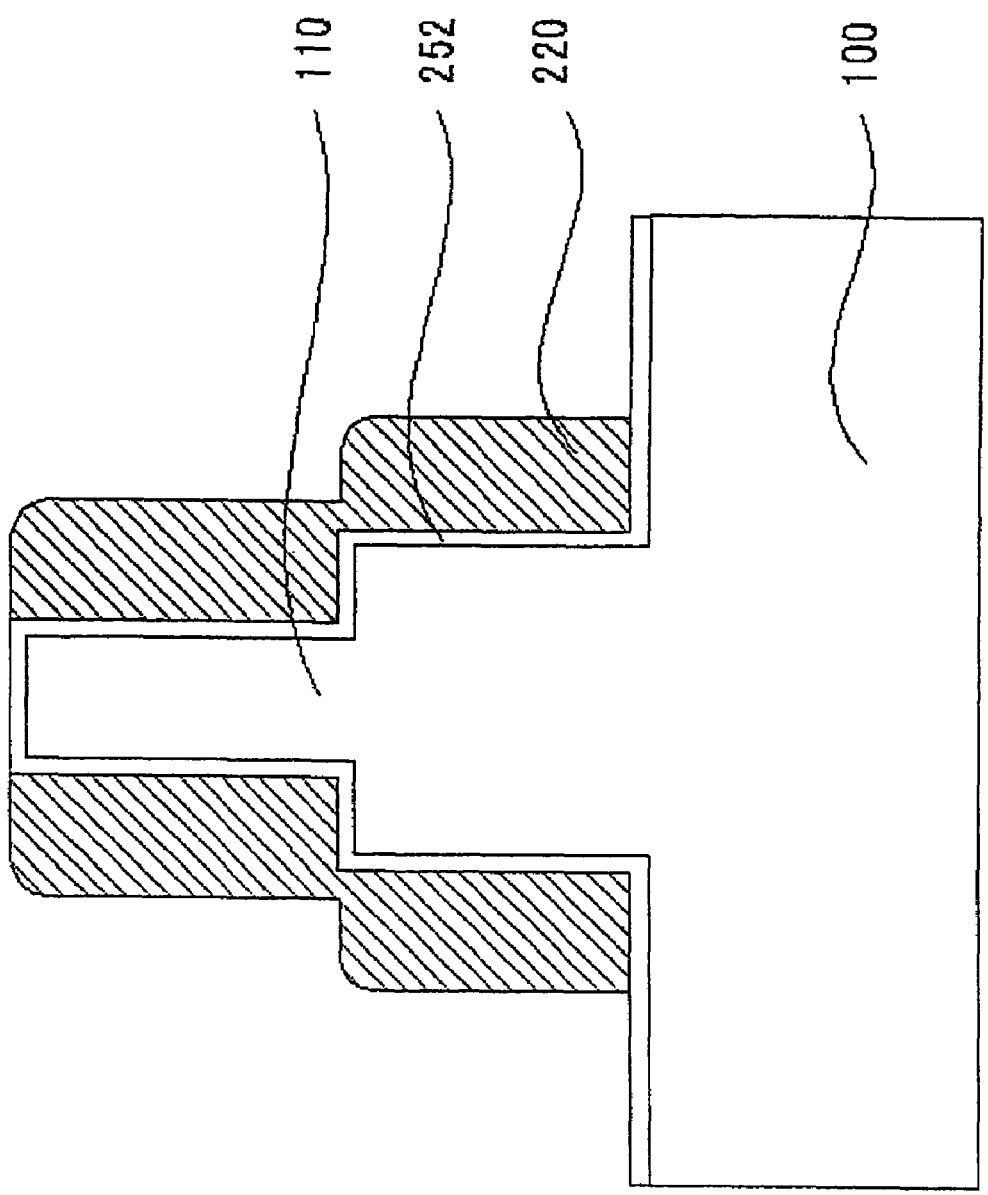
FIG. 15 is a schematic cross section for explaining another step of the manufacturing method for the semiconductor memory device according to Embodiment 4.

After that, the fifth insulating film 220 is patterned by anisotropic etching to form a sidewall spacer around the periphery of the columnar semiconductor portion 110 (FIG. 15).

Figure 16:
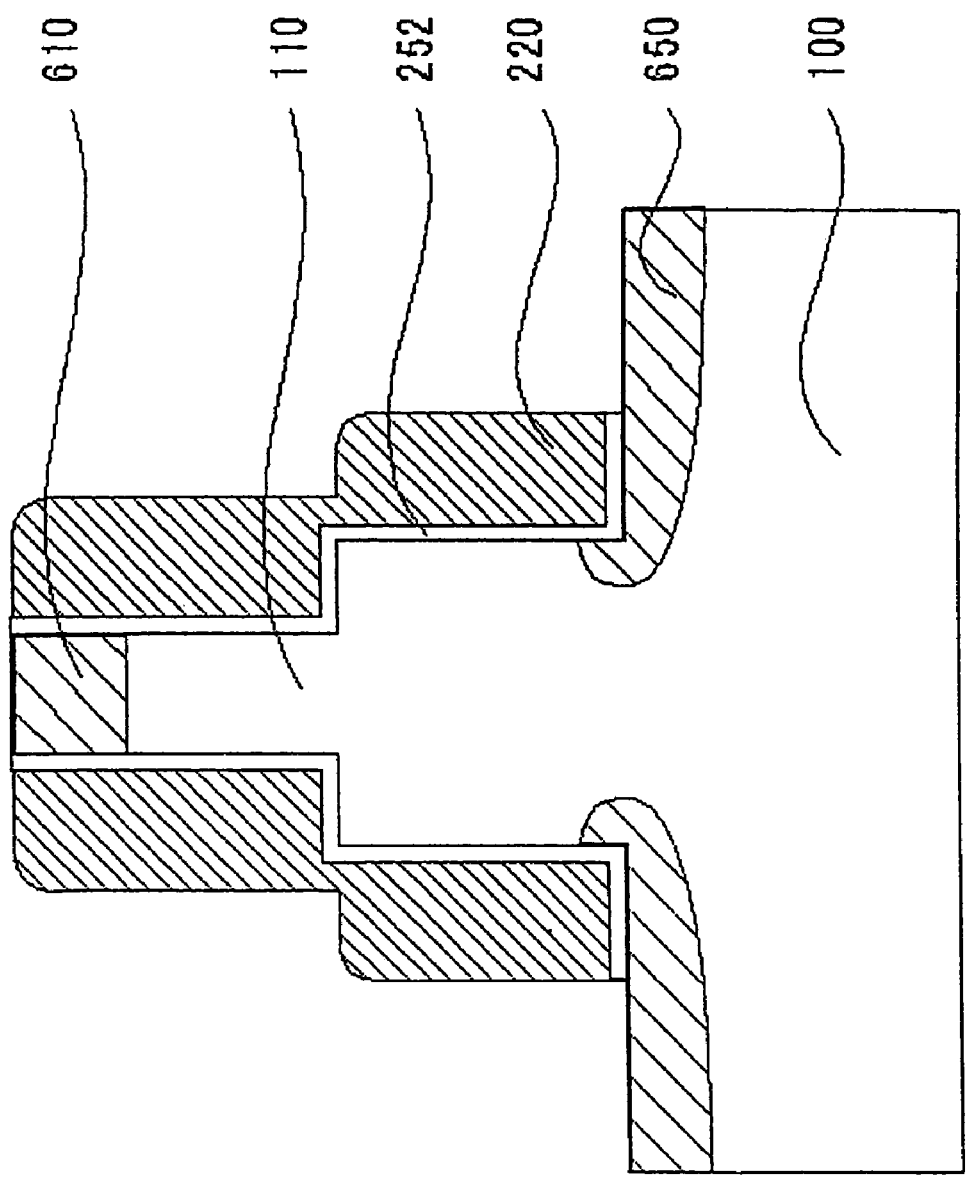
FIG. 16 is a schematic cross section for explaining another step of the manufacturing method for the semiconductor memory device according to Embodiment 4.

Subsequently, impurities are introduced into a portion or the whole of each of an upper section and a lower section of the columnar semiconductor portion 110 that has the step portion as well as into the semiconductor substrate 100, thereby forming the source/drain diffusion layers 610 and 650 made of n-type impurity diffusion layers (FIG. 16).

Conditions for the introduction of impurities, when ion implantation, for example, is employed, include an implantation tilt angle of about 0° to about 15°, an implantation energy of about 5 KeV to about 100 KeV, impurities of arsenic or phosphorus, and a dose of about $1 \times 10^{12}/cm^2$ to about $1 \times 10^{17}/cm^2$.

Figure 17:
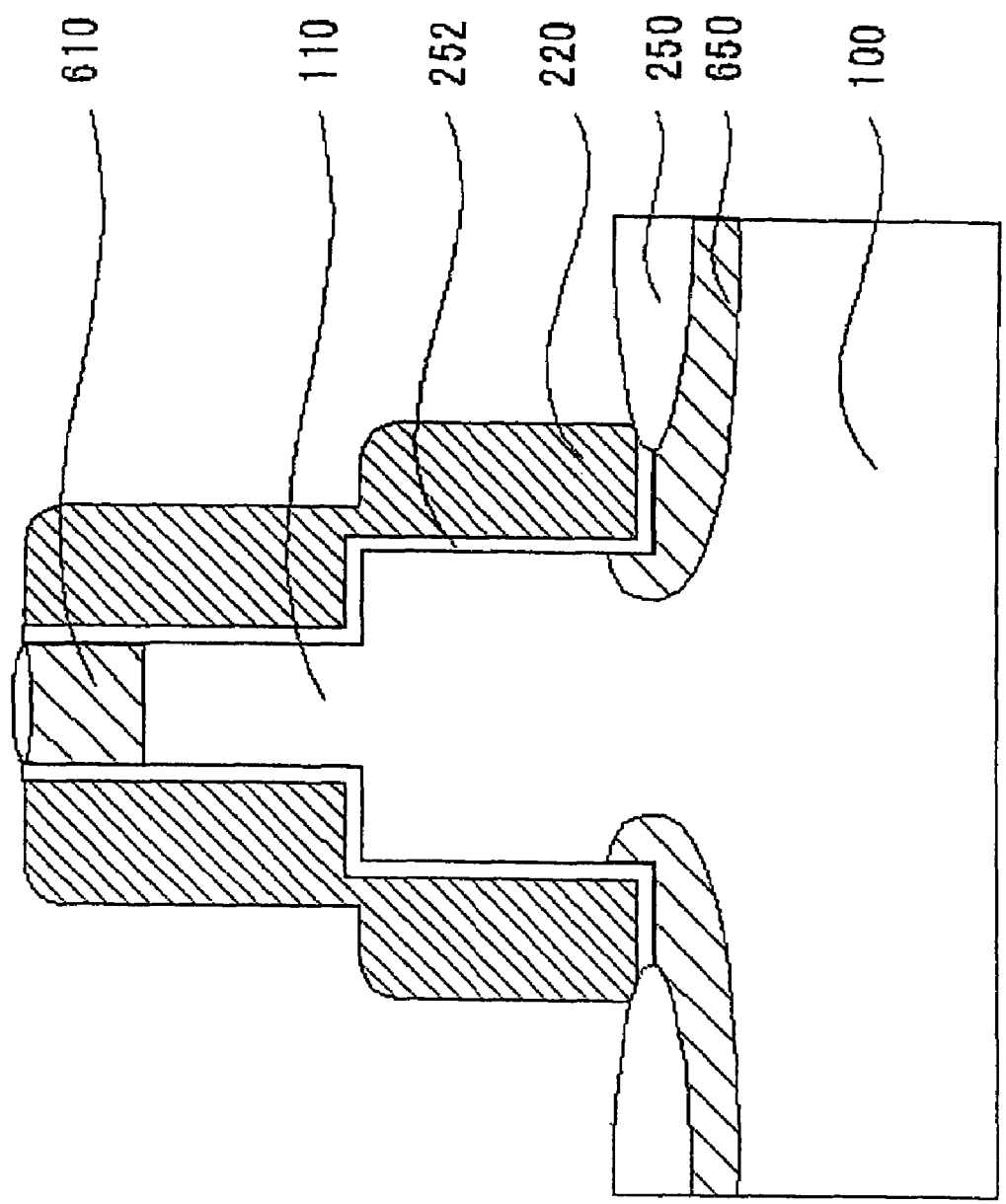
FIG. 17 is a schematic cross section for explaining another step of the manufacturing method for the semiconductor memory device according to Embodiment 4.

After that, a portion of the upper section of the columnar semiconductor portion 110 and a surface of the p-type semiconductor substrate 110 are subjected to, for example, thermal oxidation so as to form device isolation films, thereby forming, for example, silicon oxide films to a thickness of 10 nm to 500 nm, as sixth insulating films 250 (FIG. 17). Here, the method of forming the device isolation films is not particularly limited as long as the resulting device isolation films can isolate memory cells from one another. Other than thermal oxidation, CVD may be employed to deposit silicon oxide films as the device isolation films.

Figure 18:
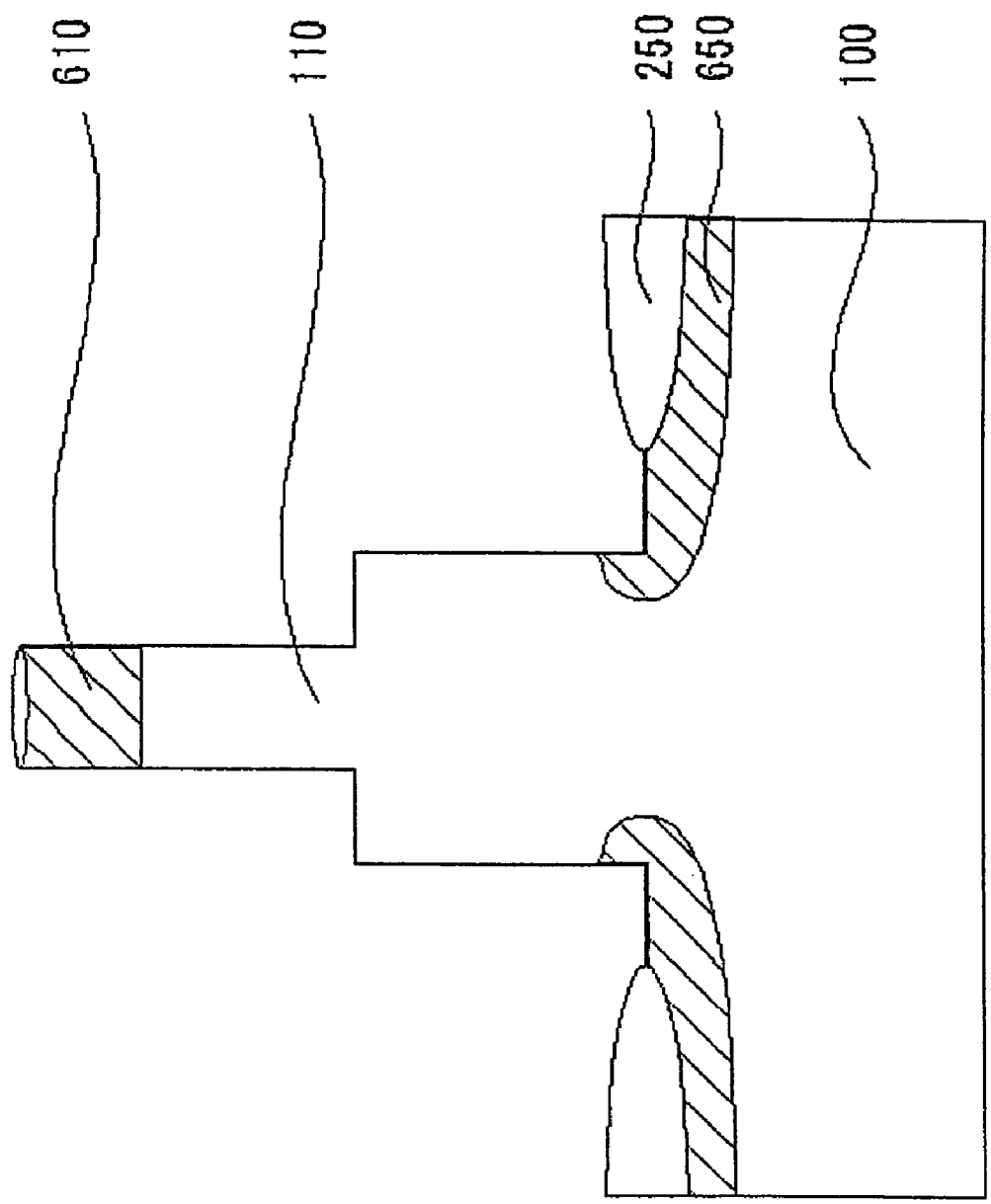
FIG. 18 is a schematic cross section for explaining another step of the manufacturing method for the semiconductor memory device according to Embodiment 4.

Next, the fifth insulating film 220 is selectively removed by means of, for example, isotropic etching (FIG. 18). Subsequently, by utilizing oblique ion implantation upon necessity, channel ion implantation is carried out on the periphery of the columnar semiconductor portion 110. Conditions for the channel ion implantation include, for example, an implantation tilt angle of about 5° to about 45°, an implantation energy of about 5 KeV to about 100 KeV, impurities of boron, and a dose of about $1 \times 10^{11}/cm^2$ to about $1 \times 10^{13}/cm^2$. In the channel ion implantation, ions are preferably implanted in multiple directions to enable a uniform impurity concentration at the surface.

Instead of the ion implantation, channel ion doping may be carried out by depositing an oxide film containing boron by means of CVD and utilizing boron diffusion from the oxide film.

Further, such introduction of impurities into the channel region of the columnar semiconductor portion 110 may be carried out before the completion of the columnar semiconductor portion 110. The means for the channel ion doping is not particularly limited as long as it is a means which enables the same impurity concentration in a channel region of the columnar semiconductor portion 110.

Figure 19:
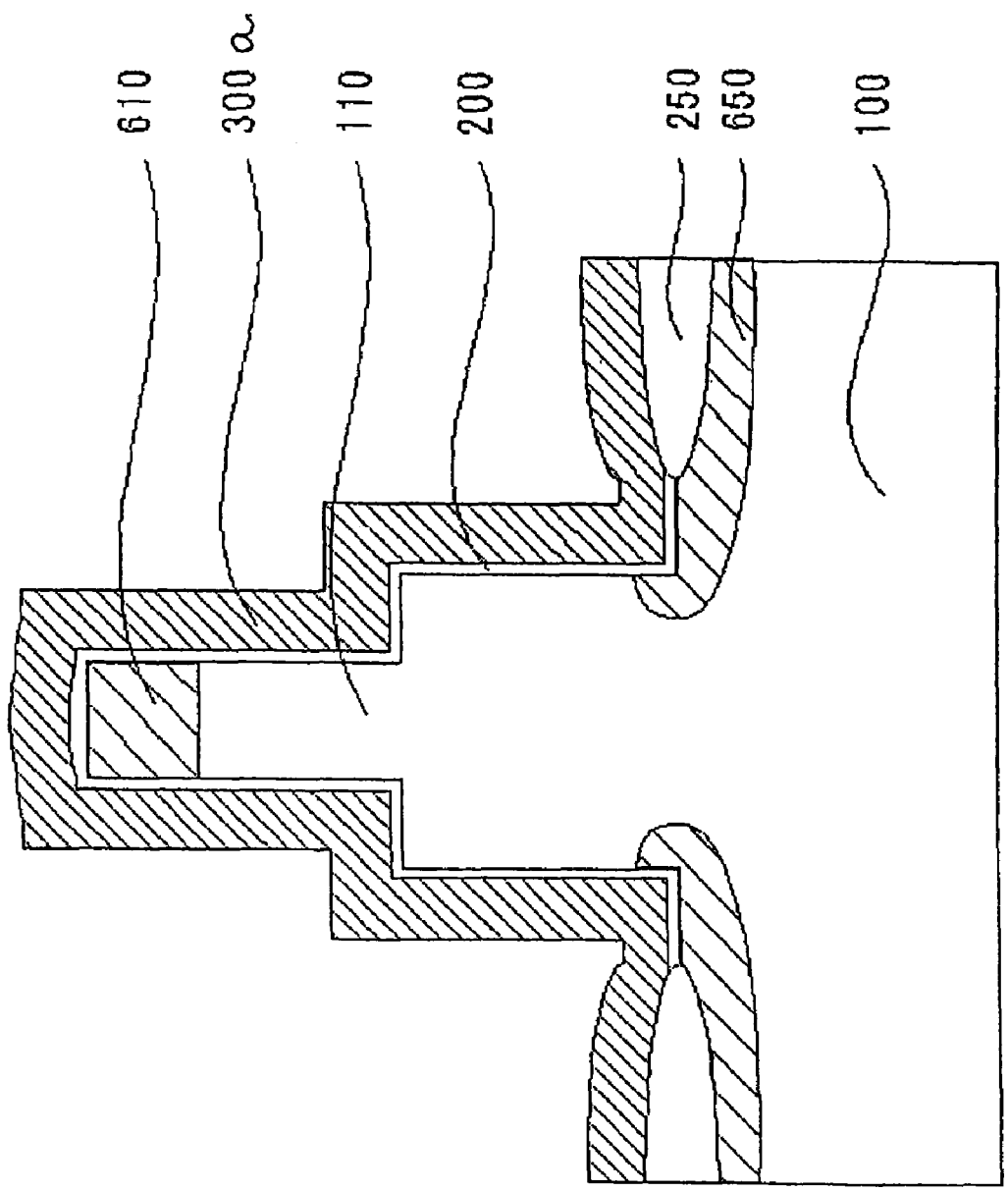
FIG. 19 is a schematic cross section for explaining another step of the manufacturing method for the semiconductor memory device according to Embodiment 4.

Subsequently, thermal oxidation, for example, is carried out to form, for example, a silicon oxide film to a thickness of about 10 nm around the periphery of the columnar semiconductor portion 110, as the seventh insulating film 200 to be the tunnel oxide film. Here, the seventh insulating film 200 is not limited to the thermal oxidation film, but may be either a CVD oxide film or an oxinitride film. Further, a polycrystalline silicon film 300a, for example, is deposited to a thickness of about 20 nm to about 200 nm as the charge-storage layers 300 (FIG. 19).

Figure 20:
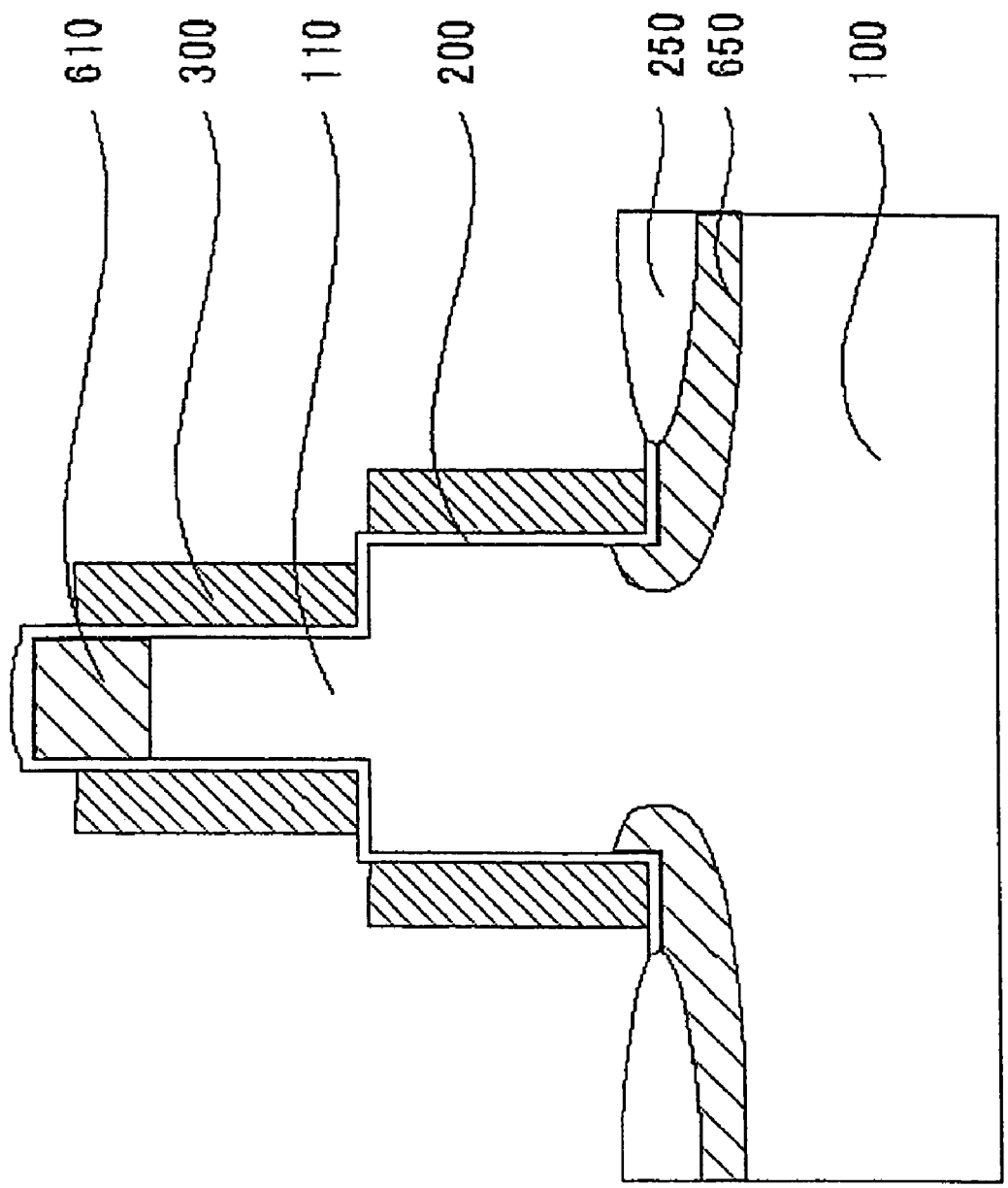
FIG. 20 is a schematic cross section for explaining another step of the manufacturing method for the semiconductor memory device according to Embodiment 4.

After that, upon necessity, impurities are introduced into the polycrystalline silicon film 300a by means of, for example, ion implantation. Conditions for the ion implantation include impurities of arsenic or phosphorus, an implantation energy of about 5 KeV to about 100 KeV, and a dose of about $1 \times 10^{12}/cm^2$ to about $1 \times 10^{17}/cm^2$. Next, the polycrystalline silicon film 300a is divided into the charge-storage layers (floating gates) 300 by anisotropic etching by means of, for example, reactive ion etching by utilizing the step portion of the columnar semiconductor portion 110 to form the charge-storage layers (floating gates) 300 around the periphery of the columnar semiconductor portion 110 in a self-aligned manner (FIG. 20).

The method, procedure or the like for introducing impurities into the polycrystalline silicon film 300a are not particularly limited as long as it is a method which enables a desired impurity concentration. More specifically, impurities may be introduced into the polycrystalline silicon film 300a not immediately after the polycrystalline silicon film 300a is deposited but after it is divided by anisotropic etching by means of, for example, reactive ion etching. Further, impurities may be introduced into the polycrystalline silicon film 300a not by ion implantation but either by depositing an oxide film containing arsenic or phosphorus by means of CVD and utilizing arsenic or phosphorus diffusion from the oxide film, or by doping arsenic or phosphorus in situ when the polycrystalline silicon film 300a is deposited.

The means of etching the polycrystalline silicon film 300a is not limited to the dividing by anisotropic etching to form the charge-storage layers in a self-aligned manner as long as it is a means which enables a desired configuration. Other than the above method, a method may be used, comprising: depositing the polycrystalline silicon film 300a; then depositing, for example, a CVD oxide film; patterning the CVD oxide film into a sidewall spacer by means of, for example, reactive ion etching to form the sidewall spacer on the polycrystalline silicon film 300a around the periphery of the columnar semiconductor portion 110, with the seventh insulating layer 200 interposed between the polycrystalline silicon film 300a and the columnar semiconductor portion 110; and dividing the polycrystalline silicon film 300a by means of, for example, isotropic etching such as CDE (chemical dry etching).

After the polycrystalline silicon film 300a is divided by means of etching, oblique ion implantation, for example, may be carried out on the corner of the step portion of the columnar semiconductor portion 110. Conditions for the ion implantation include, for example, impurities of arsenic or phosphorus, an implantation energy of about 5 KeV to about 100 KeV, a dose of about $1\times10^{12}/cm^2$ to about $1\times10^{17}/cm^2$, and an implantation tilt angle of about 5° to about 45°.

Figure 21:
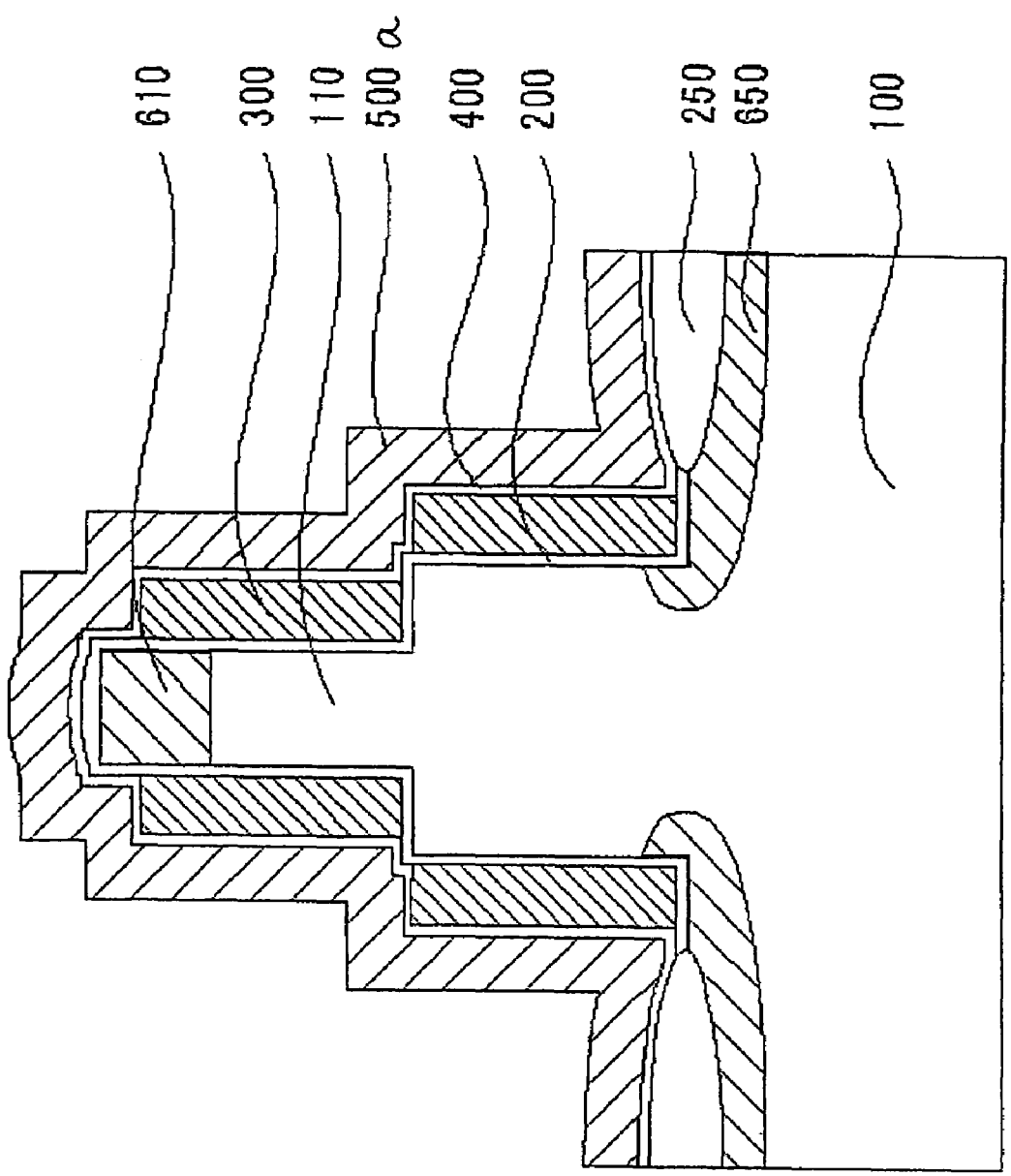
FIG. 21 is a schematic cross section for explaining another step of the manufacturing method for the semiconductor memory device according to Embodiment 4.

Next, the interlayer insulating film 400 is formed to cover the exposed surfaces of each charge-storage layer 300. The interlayer insulating film 400 may be made of, for example, a so-called ONO film. More specifically, the interlayer insulating film 400 may be provided by sequentially forming: a silicon oxide film having a thickness of 5 nm to 10 nm that covers the surfaces of each charge-storage layer 300 by thermal oxidation; a silicon nitride film having a thickness of 5 nm to 10 nm by deposition by means of CVD; and a silicon oxide film having a thickness of 5 nm to 10 nm by means of CVD. Subsequently, a polycrystalline silicon film 500a, for example, is deposited to a thickness of 15 nm to 150 nm as the control gate 500 (FIG. 21).

Figure 22:
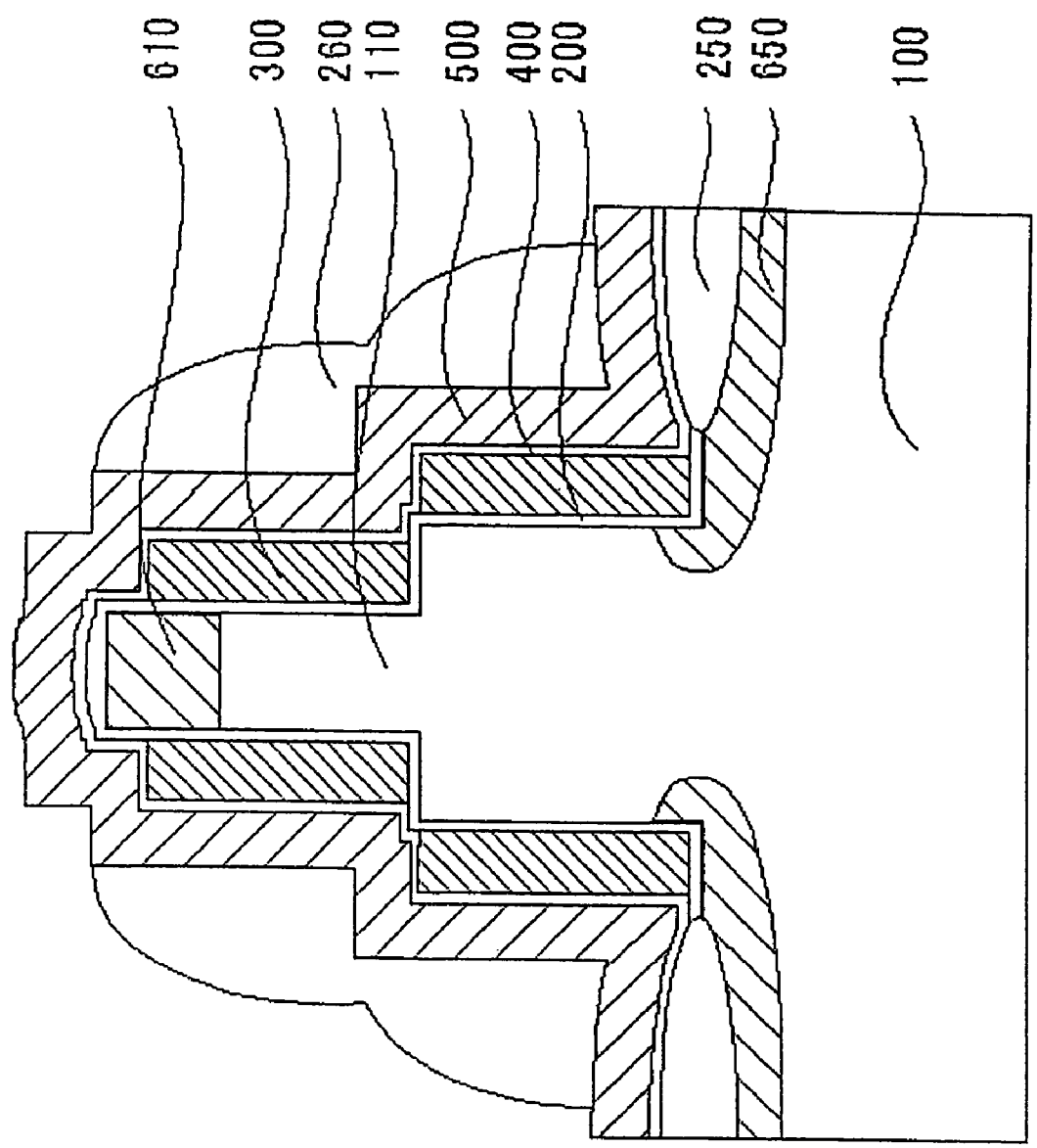
FIG. 22 is a schematic cross section for explaining another step of the manufacturing method for the semiconductor memory device according to Embodiment 4.

Next, a silicon oxide film is deposited as an eighth insulating film 260. Then, the eight insulating film 260 is etched by means of, for example, reactive ion etching by using as a mask a resist R2 that was formed into a pattern of wordlines by a known photolithography technique (FIG. 22). The method of etching the eight insulating film 260 is not limited to the reactive ion etching as long as it is a method which enables a desired configuration, and isotropic etching, for example, may be used. The material of the eight insulating film 260 is not particularly limited as long as it is a material which is not etched or the etching rate of which is lower than that of polycrystalline silicon at the time of the etching of the polycrystalline silicon film 500a, and a silicon nitride film, a conductive film or a laminated film of two or more kinds of materials, for example, may be used.

Figure 23:
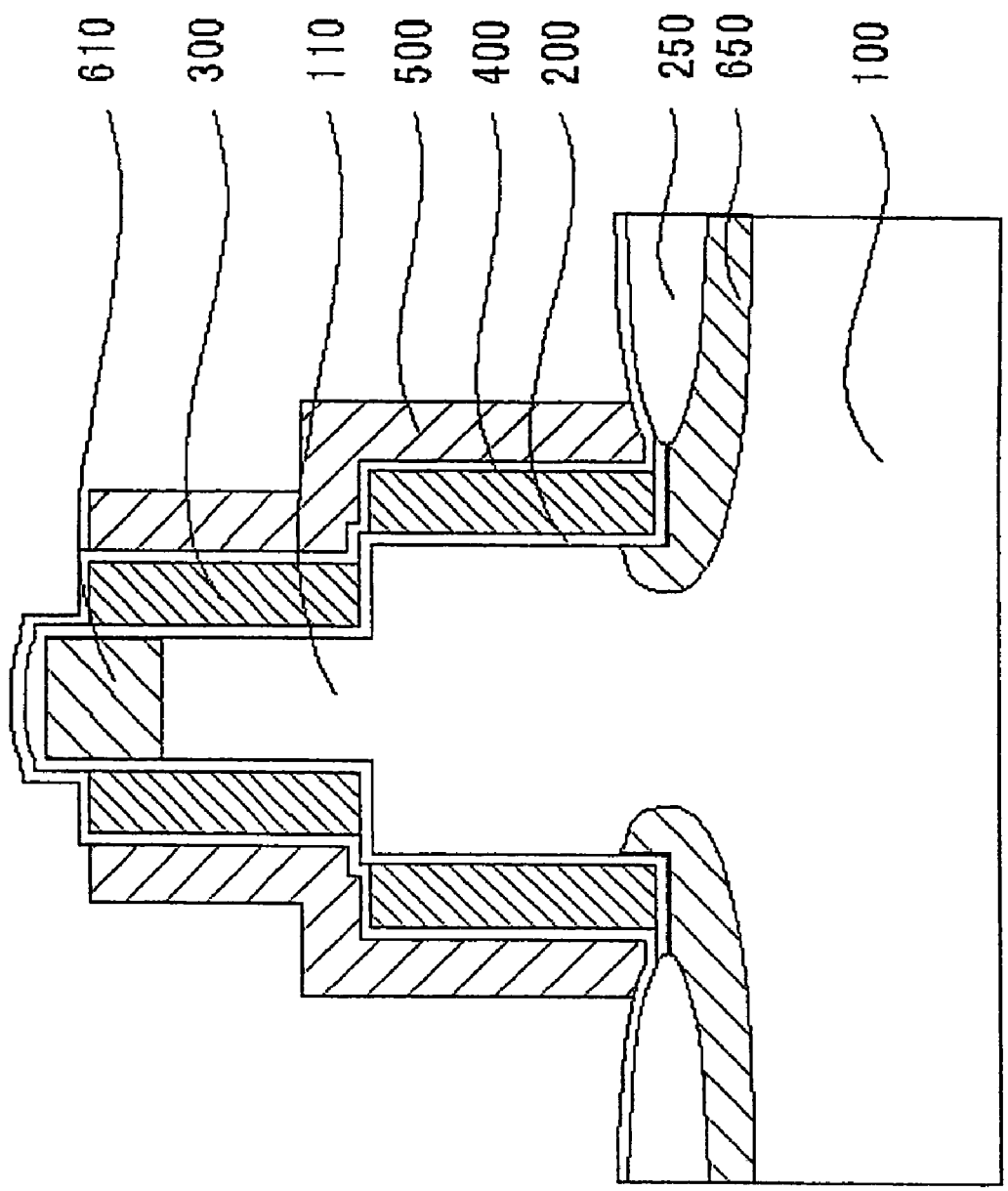
FIG. 23 is a schematic cross section for explaining another step of the manufacturing method for the semiconductor memory device according to Embodiment 4.

Subsequently, the polycrystalline silicon film 500a is patterned into the wordlines by using the eight insulating film 260 as a hard mask. After that, the eight insulating film 260 is selectively removed by means of, for example, isotropic etching (FIG. 23).

Upon necessity, impurities may be introduced into the polycrystalline silicon film 500a. The method by which and the time when to introduce impurities are not particularly limited as long as a desired impurity concentration is enabled. Accordingly, impurities may be introduced into the polycrystalline silicon film 500a not immediately after the polycrystalline silicon film 500a is deposited but after the eight insulating film 260 is selectively removed after the polycrystalline silicon film 500a is etched. Further, impurities may be introduced into the polycrystalline silicon film 500a not by ion implantation but either by depositing an oxide film containing arsenic or phosphorus by means of CVD and utilizing arsenic or phosphorus diffusion from the oxide film, or by doping arsenic or phosphorus in situ when the polycrystalline silicon film 300a is deposited.

Next, the interlayer insulating film 910 is deposited, etch back is carried out by means of, for example, isotropic etching, and then a contact and the metal wiring 900 are formed by means of a known technique. Thus, a memory cell shown in FIG. 8 is completed.

Embodiment 5

Figure 24:
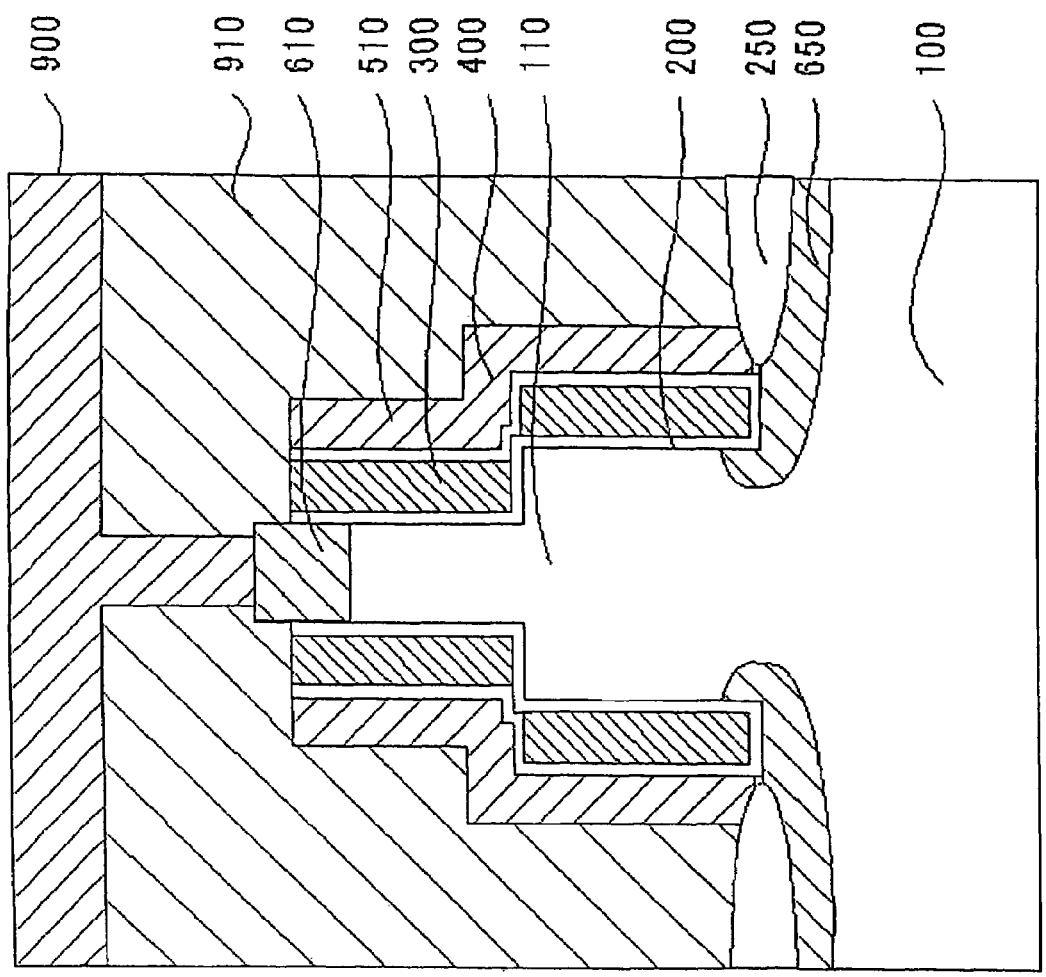
FIG. 24 is a schematic cross section of a semiconductor memory device according to an embodiment 5 of the present invention.
Figure 25:
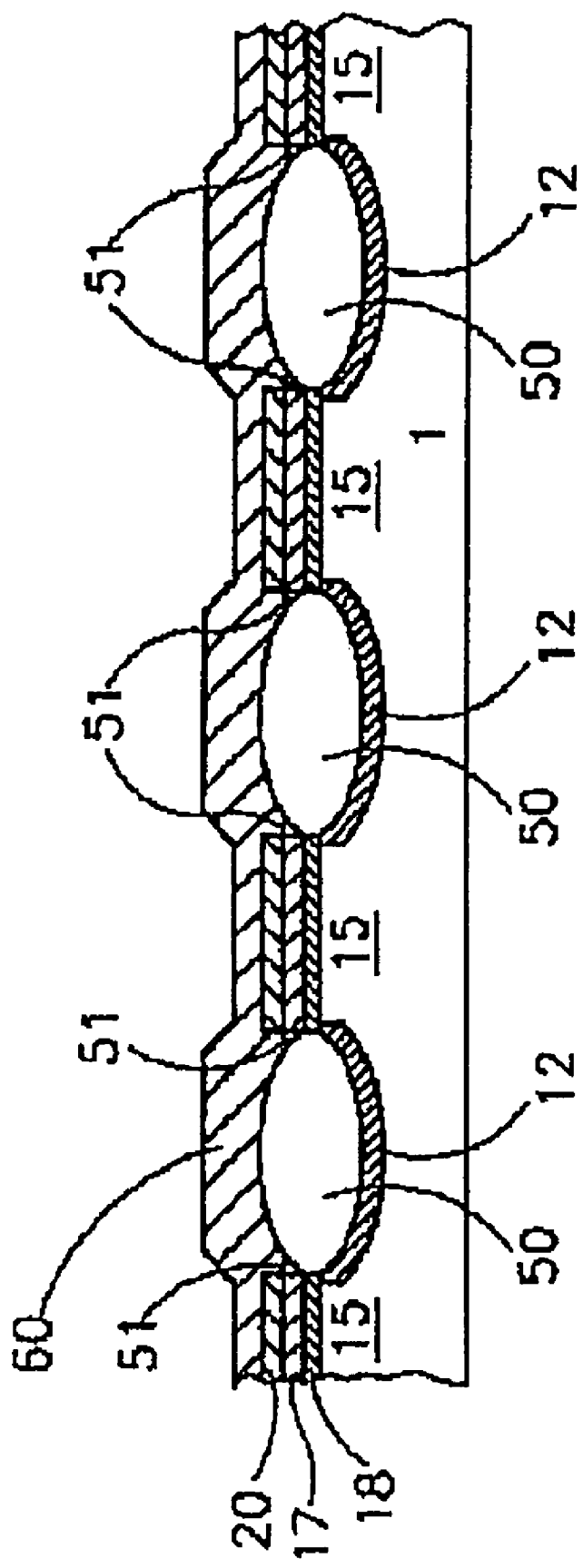
FIG. 25 is a schematic cross section of a conventional semiconductor memory device.

A memory cell shown in FIG. 24 has the same construction as that of the memory cell described in Embodiment 1 except that the control gate 510 is made of a metal. Examples of materials of the control gate 510 include metals such as aluminum, tungsten, copper and the like. Since the control gate is made of a metal, it is possible to reduce the resistance of wordlines and suppress the wiring delay and the like.

Also in the memory cell of Embodiment 5, the read out, write and erasure operations can be carried out in the same manner as in Embodiment 1.

According to the semiconductor memory device of the present invention, it is possible to store two-bit or more data in an area occupied by one columnar semiconductor portion.

Also, according to the semiconductor memory device of the present invention, it is possible to suppress the punch-through phenomenon derived from a reduction in memory cell area and thus the decrease in drive voltage if the height of the columnar semiconductor memory device is increased.

Further, according to the manufacturing method of the semiconductor memory device of the present invention, not the planar technology in which the precision in the division of charge-storage layers relies on the photolithography technology but a maskless self-alignment process which does not rely on the photolithography technology is employed, thereby ensuring the simplicity of the method, the shortening of the length of period for manufacture, and the increase in yield. As a result, it is possible to provide a semiconductor memory device in which variations in cell characteristics are reduced and which is available at a low cost.

What is claimed is:

1. A semiconductor memory device comprising:
   a semiconductor substrate of a first conductivity type; and
   a memory cell including:
   (i) a columnar semiconductor portion formed on the substrate,
   (ii) at least two charge-storage layers formed around a periphery of the columnar semiconductor portion and divided in a direction vertical to the semiconductor substrate, and (iii) a control gate that covers at least a portion of charge-storage layers, wherein the memory cell is capable of holding two-bit or more data.

2. The semiconductor memory device of claim 1, wherein the columnar semiconductor portion has at least one step portion and the charge-storage layers are divided by utilizing the step portion as a boundary of the charge-storage layers.

3. The semiconductor memory device of claim 1, wherein the control gate is made of a metal.

4. The semiconductor memory device of claim 1, wherein the charge-storage layers are made of polycrystalline silicon.

5. The semiconductor memory device of claim 1, further comprising either:
(1) impurity diffusion layers of a second conductivity type formed respectively above and below the columnar semiconductor portion, or
(2) a first impurity diffusion layer of a second conductivity type and second impurity diffusion layers of a first conductivity type, the first impurity diffusion layer formed within the columnar semiconductor portion, the second impurity diffusion layers formed respectively above and below the first impurity diffusion layer.

6. The semiconductor memory device of claim 1, the control gate covers all the surfaces of each charge-storage layer.

7. The semiconductor memory device of claim 1, the semiconductor substrate and the columnar semiconductor portion are made of silicon.

8. A manufacturing method of a semiconductor memory device comprising the steps of:
forming a columnar semiconductor portion on a semiconductor substrate of a first conductivity type;
forming at least two charge-storage layers around a periphery of the columnar semiconductor portion, the charge-storage layers divided in a direction vertical to the semiconductor substrate; and
forming a control gate that covers at least a portion of charge-storage layers.

9. A manufacturing method of a semiconductor memory device comprising the steps of:
forming an upper section of a columnar semiconductor portion on a semiconductor substrate of a first conductivity type;
forming a lower section of the columnar semiconductor portion so that the columnar semiconductor portion obtained has at least one step portion by carrying out at least once the steps of:
(i) forming a sidewall spacer around a periphery of the upper section of the columnar semiconductor portion, the sidewall spacer made of an insulating film, and
(ii) digging the semiconductor substrate by using the sidewall spacer,
removing the sidewall spacer and forming a charge-storage layer formation material layer around a periphery of the columnar semiconductor portion;
dividing the charge-storage layer formation material layer into at least two charge-storage layers by utilizing the step portion to form the charge-storage layers in a self-aligned manner; and
forming a control gate that covers at least a portion of charge-storage layers.

10. The method of claim 9, further comprising the step of: forming impurity diffusion layers of a second conductivity type respectively above and below the columnar semiconductor portion, the forming step being carried out after the step of forming the columnar semiconductor portion and before the step of removing the sidewall spacer and forming a charge-storage layer formation material layer.

11. The method of claim 9, wherein the charge-storage layer formation material layer is divided by anisotropic etching by means of reactive ion etching to form the charge-storage layers.

* * * * *